(12) United States Patent
Yoshida et al.

(10) Patent No.: US 12,733,243 B2
(45) Date of Patent: Sep. 8, 2026

(54) SEMICONDUCTOR DEVICE AND METHOD OF MANUFACTURING THE SAME

(71) Applicant: Renesas Electronics Corporation, Tokyo (JP)

(72) Inventors: Tetsuya Yoshida, Tokyo (JP); Shibun Tsuda, Tokyo (JP); Hideki Makiyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 380 days.

(21) Appl. No.: 18/433,827

(22) Filed: Feb. 6, 2024

(65) Prior Publication Data

US 2024/0290791 A1 Aug. 29, 2024

(30) Foreign Application Priority Data

Feb. 27, 2023 (JP) ................................ 2023-028326

(51) Int. Cl.

| | |
|---|---|
| ***H10D 64/27*** | (2025.01) |
| ***H10D 30/63*** | (2025.01) |
| ***H10D 86/00*** | (2025.01) |
| ***H10D 86/01*** | (2026.01) |
| ***H10P 30/20*** | (2026.01) |
| ***H10P 90/00*** | (2026.01) |
| ***H10W 10/10*** | (2026.01) |

(52) U.S. Cl.

CPC ......... *H10D 64/518* (2025.01); *H10D 30/637* (2025.01); *H10D 64/514* (2025.01); *H10D 86/01* (2025.01); *H10D 86/201* (2025.01); *H10P 30/204* (2026.01); *H10P 30/21* (2026.01); *H10P 90/1906* (2026.01); *H10W 10/181* (2026.01)

(58) Field of Classification Search

CPC ............... H10D 64/514; H10D 64/518; H10D 30/0227; H10D 30/601; H10D 30/637; H10D 86/01; H10D 86/201–215; H10D 87/00; H10P 30/21; H10P 30/204; H10P 90/1906; H10W 10/181

See application file for complete search history.

(56) References Cited

U.S. PATENT DOCUMENTS

| | | | | |
|---|---|---|---|---|
| 10,446,401 | B2 | 10/2019 | Makiyama | |
| 2013/0334608 | A1* | 12/2013 | Ikoma ............... | H10D 84/0128 257/368 |

(Continued)

FOREIGN PATENT DOCUMENTS

| | | | |
|---|---|---|---|
| JP | 2019-102520 | A | 6/2019 |
| WO | 2019/097568 | A1 | 5/2019 |

*Primary Examiner* — Scott B Geyer

(74) *Attorney, Agent, or Firm* — Rimon P.C.

(57) ABSTRACT

A low withstand voltage MISFET and a high withstand voltage MISFET are formed on an SOI substrate. An ON operation and an OFF operation of the low withstand voltage MISFET are controlled by a first gate potential to be supplied to a first gate electrode and a back gate potential to be supplied to a first well region. An ON operation and an OFF operation of the high withstand voltage MISFET are controlled by a second gate potential to be supplied to a second gate electrode in a state where a second well region is electrically floating. An absolute value of a second power supply potential to be supplied to a second impurity region is larger than an absolute value of a first power supply potential to be supplied to a first impurity region.

18 Claims, 23 Drawing Sheets

(56) References Cited

U.S. PATENT DOCUMENTS

| | | | | |
|---|---|---|---|---|
| 2016/0013207 | A1* | 1/2016 | Makiyama | H10D 64/518 438/164 |
| 2016/0087069 | A1* | 3/2016 | Oda | H10D 12/031 257/77 |
| 2016/0315013 | A1* | 10/2016 | Tokita | H10D 84/013 |
| 2017/0025442 | A1* | 1/2017 | Flachowsky | H10D 87/00 |
| 2018/0342537 | A1* | 11/2018 | Yamamoto | H10D 87/00 |
| 2020/0313000 | A1 | 10/2020 | Eujima et al. | |

* cited by examiner 1A
2A
1Q
2Q
SI
EP
SL
BOX
PW1
PW2
DNW
SUB
10
SW2
OS
GE1
GI1
GE2
GI2
LDD1
LDD2
ND1
ND2
STI
SR1
SR2

4A
4Qn
4Qp
SI
SW2
OS
GI4
GE4n
GE4p
LDD4n
LDD4p
ND4
PD4
STI
NW4
PW4
DNW
SUB

| | 1Q | 2Q |
|---|---|---|
| THICKNESS OF GATE INSULATING FILM | 2.5nm | 6.0nm |
| GATE LENGTH | 45nm/40nm | 250nm |
| POWER SUPPLY POTENTIAL Vd1, Vd2 | 0.79V | 1.8V |
| LDD1, LDD2 | As: 5keV, $3.0\times10^{14}/cm^2$ | As: 5keV, $5.0\times10^{12}/cm^2$<br>P: 25keV, $1.8\times10^{14}/cm^2$ |
| ND1, ND2 | As: 5keV, $2.0\times10^{15}/cm^2$<br>P: 8keV, $3.0\times10^{15}/cm^2$ | As: 5keV, $2.0\times10^{15}/cm^2$<br>P: 8keV, $3.0\times10^{15}/cm^2$ |

1A
2A
1Q
2Q
EP
SL
BOX
PW1
PW2
DNW
SUB
10
LDD1
LDD2
SW2
OS
GE1
GI1
GE2
GI2
20

2A
1A
HM
HM
HM
HM
IF1
SL
BOX
STI
STI
STI
IF1
SL
BOX
SUB
10

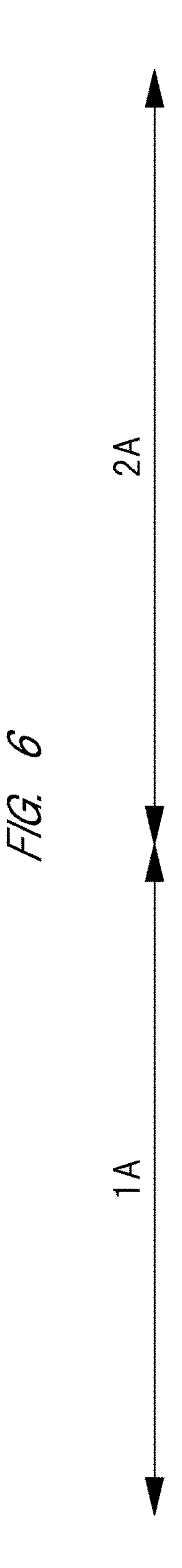
FIG. 6
2A
1A
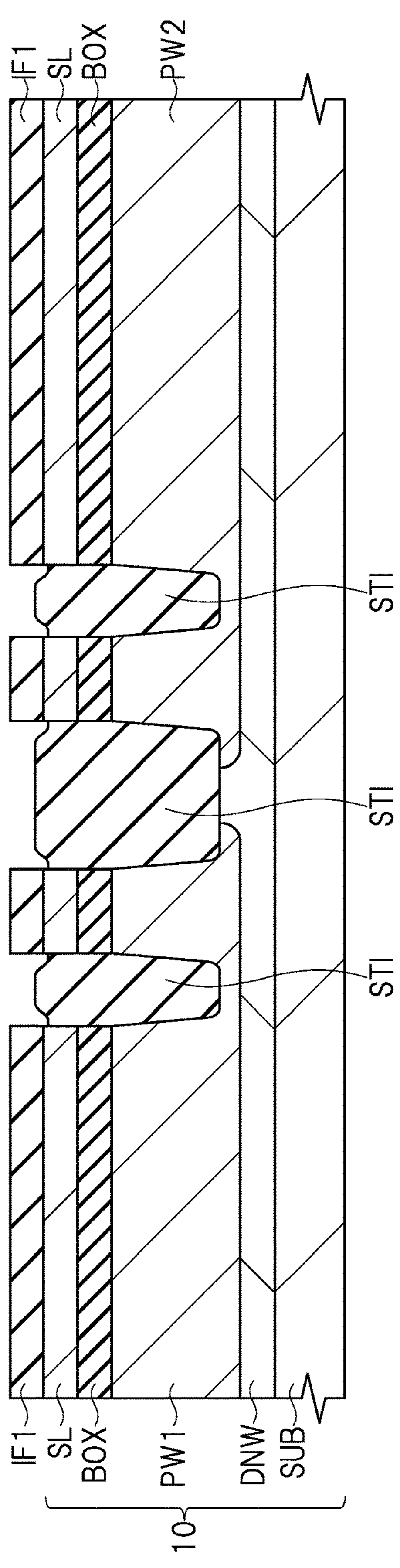
IF1
SL
BOX
PW2
STI
STI
STI
IF1
SL
BOX
PW1
DNW
SUB
10

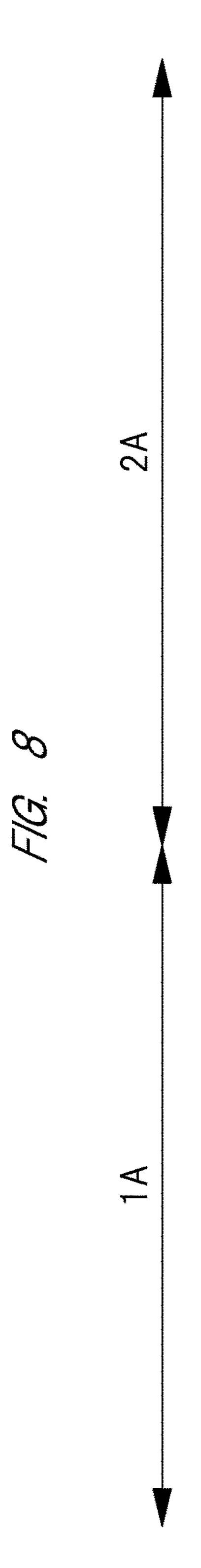
FIG. 8
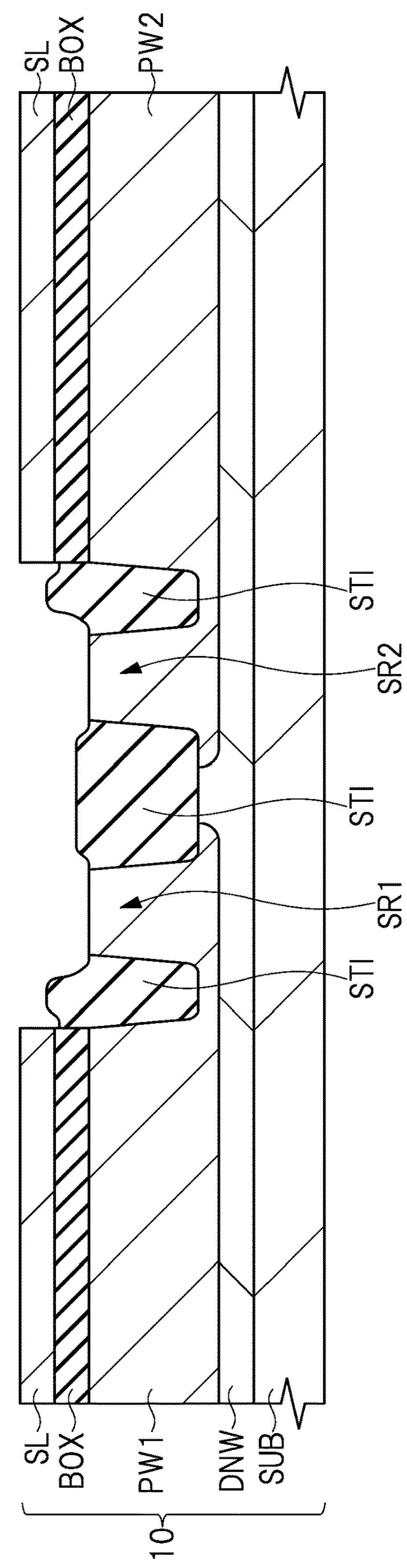

2A
1A
GI2
IF2
CF1
GI1
SL
BOX
PW2
STI
SR2
STI
SR1
STI
SL
BOX
PW1
DNW
SUB
10

1A
2A
CP
(IF2)
GE2
(CF1)
GI2
GE1
(CF1)
GI1
SL
BOX
PW2
PW1
DNW
SUB
STI
SR2
SR1
10

1A
2A
SL
BOX
PW1
PW2
DNW
SUB
10
SW1 (IF4)
OS (IF3)
CP
GE1
GI1
GE2
GI2
RP2
IF4
IF3
STI
SR1
SR2

1A
2A
EP
SL
BOX
PW1
PW2
DNW
SUB
10
SW1
OS
CP
GE1
GI1
GE2
GI2
STI
IF3
IF4
SR1
SR2

1A
2A
RP3
EP
SL
BOX
PW1
DNW
SUB
PW2
OS
GI2
GE2
GE1
GI1
STI
SR1
SR2
LDD1
10

1A
2A
RP4
EP
SL
BOX
PW1
PW2
DNW
SUB
10
OS
GE1
GI1
GE2
GI2
LDD1
LDD2
STI
SR1
SR2

1A
2A
EP
SL
BOX
PW1
DNW
SUB
10
SW2
OS
GE1
GI1
LDD1
STI
SR1
SR2
IF3
GE2
GI2
LDD2
PW2

1A
2A
1Q
2Q
RP5
EP
SL
BOX
PW1
PW2
DNW
SUB
10
SW2
OS
GE1
GI1
GE2
GI2
LDD1
LDD2
ND1
ND2
STI
SR1
SR2

2A
1A
RP3
SL
BOX
PW2
CP
GI2
GE2
STI
SR2
STI
SR1
STI
IF3
LDD1
LDD1
CP
GI1
GE1
SL
BOX
PW1
DNW
SUB
10

1A
2A
RP4
CP
GI1
GE1
CP
GI2
GE2
IF3
SL
BOX
PW2
LDD2
LDD2
STI
SR2
STI
SR1
STI
LDD1
LDD1
SL
BOX
PW1
DNW
SUB
10

1A
2A
SW1 (IF4)
OS (IF3)
GE1
GI1
CP
RP2
IF4
IF3
GI2
GE2
SW1
SL
BOX
PW1
PW2
DNW
SUB
10
LDD1
LDD2
STI
SR1
SR2

1A
2A
SW1
OS
GE1
GI1
CP
EP
GE2
GI2
IF4
IF3
SL
BOX
PW1
DNW
SUB
10
PW2
LDD1
STI
SR1
SR2
LDD2

1A
2A
1Q
2Q
EP
SL
BOX
PW1
PW2
DNW
SUB
10
SW1
OS
CP
GE1
GI1
GE2
GI2
LDD1
LDD2
ND1
ND2
STI
SR1
SR2
IF3
IF4
RP5

1A
2A
1Q
2Q
EP
SL
BOX
PW1
PW2
DNW
SUB
10
LDD1
LDD2
SW1
OS
CP
GE1
GI1
GE2
GI2
IF3
IF4
SR1
SR2
20

SEMICONDUCTOR DEVICE AND METHOD OF MANUFACTURING THE SAME

CROSS-REFERENCE TO RELATED APPLICATIONS

The disclosure of Japanese Patent Application No. 2023-028326 filed on Feb. 27, 2023 including the specification, drawings and abstract is incorporated herein by reference in its entirety.

BACKGROUND

The present invention relates to a semiconductor device and a method of manufacturing the same, for example, a semiconductor device using an SOI substrate and a method of manufacturing the same.

As a technology for a semiconductor device for low power consumption, there is the technology of forming a metal insulator semiconductor field effect transistor (MISFET) on a silicon on insulator (SOI) substrate including a semiconductor substrate, an insulating layer formed on the semiconductor substrate, and a silicon layer formed on the insulating layer. The MISFET formed on the SOI substrate has high soft error resistance, and can reduce a parasitic capacitance caused by a diffusion region formed in the silicon layer. Therefore, it is possible to achieve both the improvement in operation speed and the reduction in power consumption of the MISFET.

There are disclosed techniques listed below.

[Patent Document 1] International Publication No. WO2019/097568

[Patent Document 2] Japanese Unexamined Patent Application Publication No. 2019/102520

Patent Document 1 discloses the technology of forming a MISFET on an SOI substrate and applying a back gate potential to a well region located immediately below an insulating layer. An ON operation and an OFF operation of the MISFET are controlled by a gate potential applied to a gate electrode and the back gate potential.

In Patent Document 2, a bulk region is formed by removing a part of a silicon layer and an insulating layer of an SOI substrate. A low withstand voltage MISFET is formed on the SOI substrate, and a high withstand voltage MISFET is formed in the bulk region.

SUMMARY

The inventors of this application have been studying the formation of not only a low withstand voltage MISFET but also a high withstand voltage MISFET on an SOI substrate. An ON operation and an OFF operation of each of the low withstand voltage MISFET and the high withstand voltage MISFET can be controlled by a gate potential and a back gate potential.

However, the study by the inventors of this application has revealed the problem that a voltage applied to an insulating layer increases and the TDDB life of the insulating layer is likely to be degraded if both the gate potential and the back gate potential are used. As a result, there is a problem that the reliability of a semiconductor device is lowered.

Other problems and novel features will be apparent from the description of this specification and the accompanying drawings.

An outline of representative embodiments disclosed in this application will be briefly described as follows.

A semiconductor device according to an embodiment includes a first region in which a first MISFET of a first conductivity type is formed and a second region in which a second MISFET of the first conductivity type is formed. The semiconductor device includes: an SOI substrate including a semiconductor substrate, an insulating layer formed on the semiconductor substrate, and a semiconductor layer formed on the insulating layer; a first well region formed in the semiconductor substrate in the first region, a conductivity type of the first well region being a second conductivity type opposite the first conductivity type; a first gate insulating film formed on the semiconductor layer in the first region; a first gate electrode formed on the first gate insulating film; a first impurity region formed in the semiconductor layer located beside the first gate electrode, a conductivity type of the first impurity region being the first conductivity type; a second well region formed in the semiconductor substrate in the second region, a conductivity type of the second well region being the second conductivity type; a second gate insulating film formed on the semiconductor layer in the second region; a second gate electrode formed on the second gate insulating film; and a second impurity region formed in the semiconductor layer located beside the second gate electrode, a conductivity type of the second impurity region being the first conductivity type. A thickness of the second gate insulating film is larger than a thickness of the first gate insulating film, a gate length of the second gate electrode is longer than a gate length of the first gate electrode, an ON operation and an OFF operation of the first MISFET are controlled by a first gate potential to be supplied to the first gate electrode and a first back gate potential to be supplied to the first well region, an ON operation and an OFF operation of the second MISFET are controlled by a second gate potential to be supplied to the second gate electrode in a state where the second well region is electrically floating, and an absolute value of a second power supply potential to be supplied to the second impurity region is larger than an absolute value of a first power supply potential to be supplied to the first impurity region.

A method of manufacturing a semiconductor device according to an embodiment is a method of manufacturing a semiconductor device including a first region in which a first MISFET of a first conductivity type is formed and a second region in which a second MISFET of the first conductivity type is formed. The method of manufacturing the semiconductor device includes steps of: (a) preparing an SOI substrate including a semiconductor substrate, an insulating layer formed on the semiconductor substrate, and a semiconductor layer formed on the insulating layer; (b) forming a first well region in the semiconductor substrate in the first region, a conductivity type of the first well region being a second conductivity type opposite the first conductivity type; (c) forming a second well region in the semiconductor substrate in the second region, a conductivity type of the second well region being the second conductivity type; (d) forming a second gate insulating film on the semiconductor layer in the second region; (e) forming a first gate insulating film on the semiconductor layer in the first region; (f) forming a first gate electrode on the first gate insulating film; (g) forming a second gate electrode on the second gate insulating film; (h) forming a first impurity region in the semiconductor layer located beside the first gate electrode by ion implantation, a conductivity type of the first impurity region being the first conductivity type; and (i) forming a second impurity region in the semiconductor layer located beside the second gate electrode by ion implantation, a conductivity type of the second impurity region being the first conductivity type. A thickness of the second gate insulating film is larger than a thickness of the first gate insulating film, a gate length of the second gate electrode is longer than a gate length of the first gate electrode, and an energy of the ion implantation in the step (i) is higher than an energy of the ion implantation in the step (h).

According to an embodiment, the reliability of the semiconductor device can be improved.

BRIEF DESCRIPTION OF THE DRAWINGS

FIG. 6 is a cross-sectional view illustrating the manufacturing process of the semiconductor device subsequent to FIG. 5.

FIG. 8 is a cross-sectional view illustrating the manufacturing process of the semiconductor device subsequent to FIG. 7.

DETAILED DESCRIPTION

Figure 1:
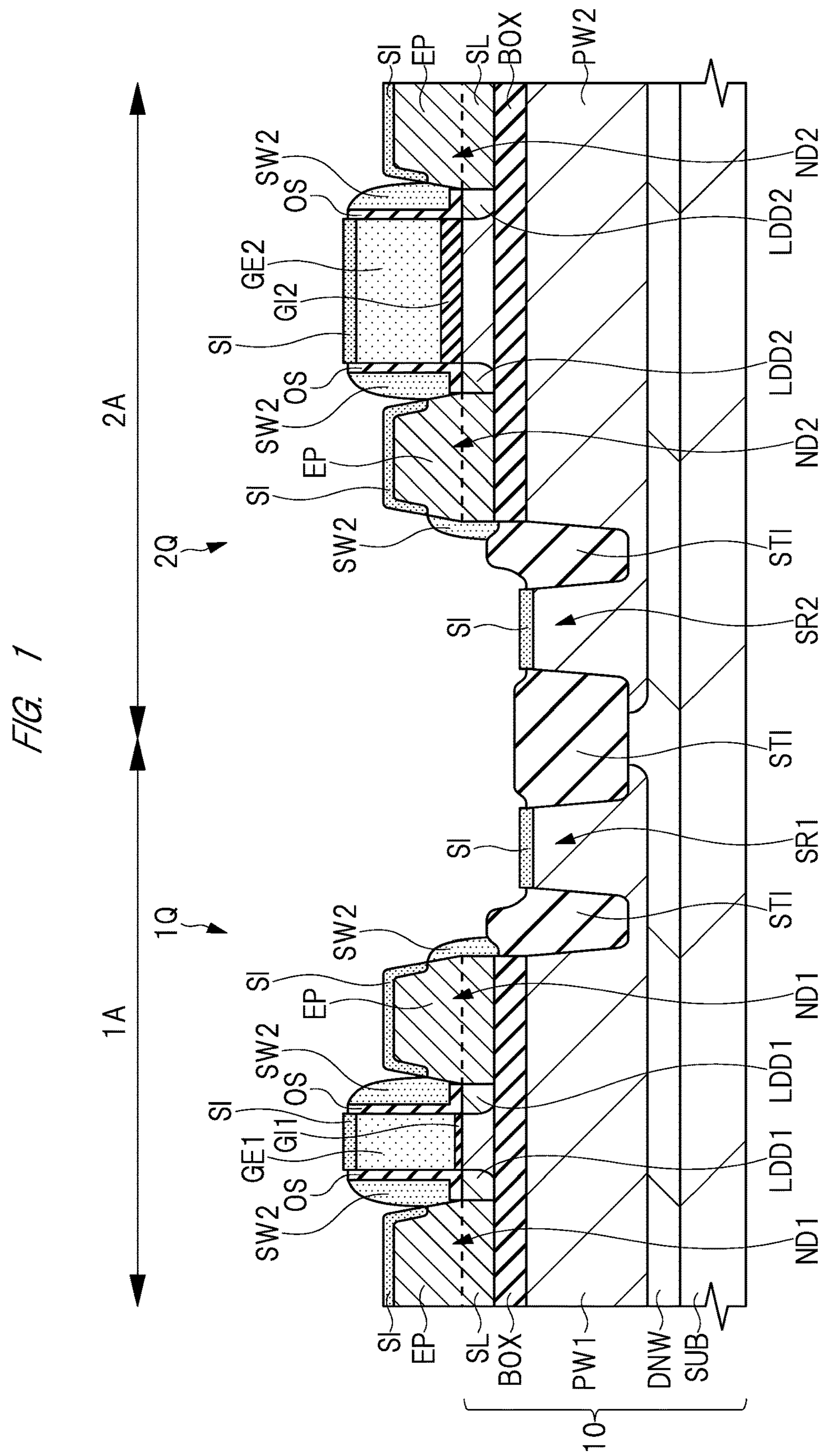
FIG. 1 is a cross-sectional view illustrating a semiconductor device according to a first embodiment.

Hereinafter, embodiments will be described in detail with reference to the drawings. Note that, in all the drawings for describing the embodiments, members having the same function are denoted by the same reference characters, and repetitive description thereof will be omitted. In addition, in the following embodiments, descriptions of the same or similar parts will not be repeated in principle unless particularly necessary.

First Embodiment

<Structure of Semiconductor Device>

A structure of a semiconductor device according to a first embodiment will be described below with reference to FIG. 1. The semiconductor device includes a region 1A and a region 2A that are different regions from each other. An n-type low withstand voltage MISFET 1Q is formed on an SOI substrate 10 in the region 1A. An n-type high withstand voltage MISFET 2Q is formed on the SOI substrate 10 in the region 2A.

The low withstand voltage MISFET 1Q is a semiconductor element intended to be driven with low power consumption and to be driven at a higher speed than the high withstand voltage MISFET 2Q. The high withstand voltage MISFET 2Q is a semiconductor element that has a higher withstand voltage than the low withstand voltage MISFET 1Q and is driven at a higher power supply potential than the low withstand voltage MISFET 1Q.

Note that a p-type low withstand voltage MISFET is also formed on the SOI substrate 10 in the region 1A, and a p-type high withstand voltage MISFET is also formed on the SOI substrate 10 in the region 2A. The structures of the p-type low withstand voltage MISFET and the p-type high withstand voltage MISFET are equivalent to those obtained by reversing the conductivity types of the structures included in the n-type low withstand voltage MISFET 1Q and the n-type high withstand voltage MISFET 2Q, respectively. Here, a detailed description thereof will be omitted.

Figure 2:
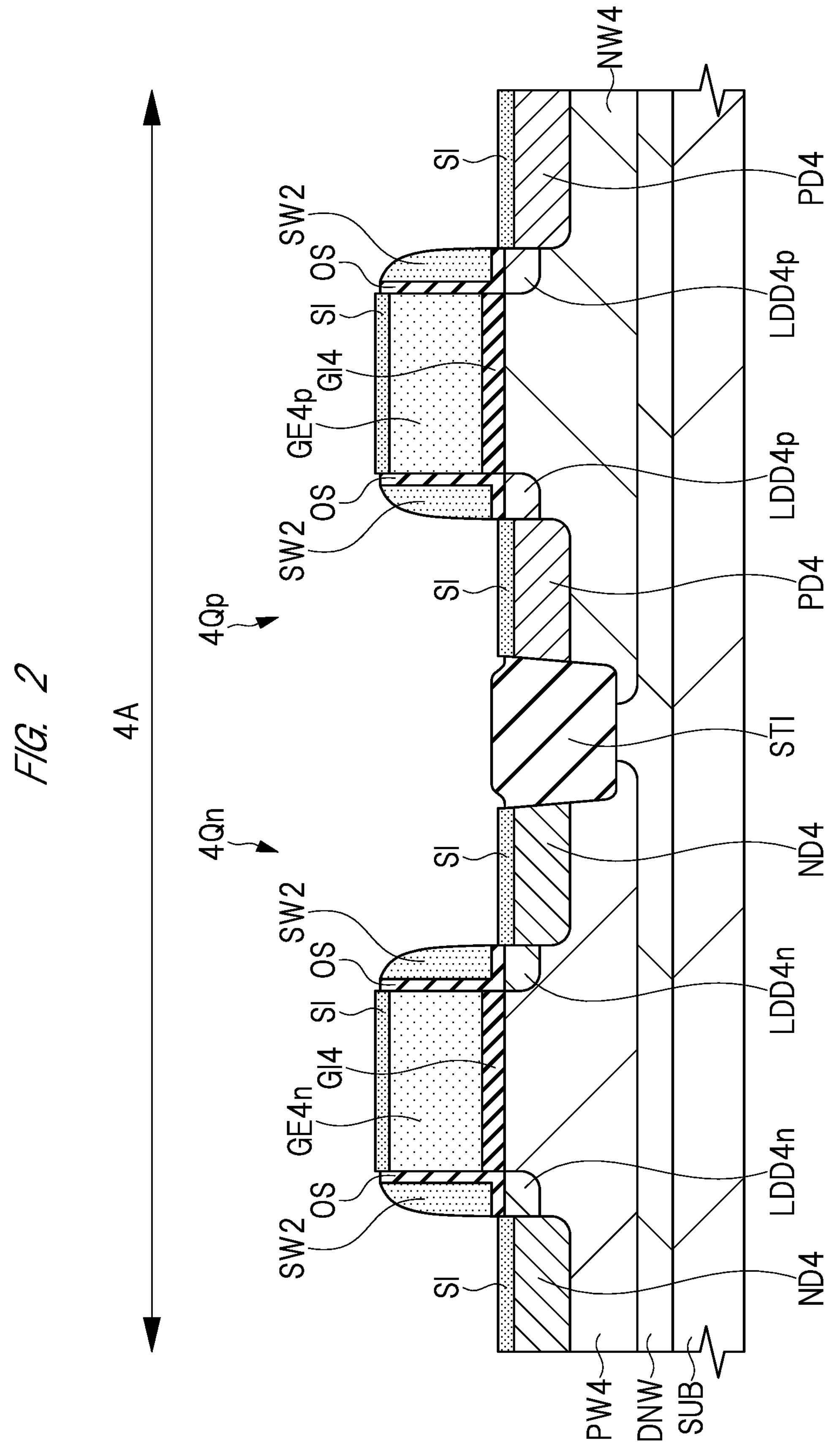
FIG. 2 is a cross-sectional view illustrating the semiconductor device according to the first embodiment.

Furthermore, as illustrated in FIG. 2, a region 4A in the semiconductor device is a bulk region from which a semiconductor layer SL and an insulating layer BOX have been removed. An n-type high withstand voltage MISFET 4Qn and a p-type high withstand voltage MISFET 4Qp are formed in the bulk region (semiconductor substrate SUB) in the region 4A. Each of the high withstand voltage MISFETs 4Qn and 4Qp is a semiconductor element that has a higher withstand voltage than the high withstand voltage MISFET 2Q and is driven at a higher power supply potential than the high withstand voltage MISFET 2Q.

In the low withstand voltage MISFET 1Q and the high withstand voltage MISFET 2Q formed on the SOI substrate 10, a gate voltage used during an operation is relatively low, and thus, thresholds thereof are likely to vary as compared with the high withstand voltage MISFETs 4Qn and 4Qp. Therefore, in the first embodiment, an ON operation and an OFF operation of each of the low withstand voltage MISFET 1Q and the high withstand voltage MISFET 2Q are controlled using not only a gate potential but also a back gate potential. As a result, the leakage current can be easily suppressed, and driving with low power consumption can be easily performed.

On the other hand, in each of the high withstand voltage MISFETs 4Qn and 4Qp, a gate voltage used during an operation is relatively high, and thus, thresholds thereof are less likely to vary as compared with the low withstand voltage MISFET 1Q and the high withstand voltage MISFET 2Q. Therefore, in the first embodiment, an ON operation and an OFF operation of each of the high withstand voltage MISFETs 4Qn and 4Qp are controlled using a gate potential without using a back bias potential. As a result, the current can be cut off during the OFF operation. Furthermore, since a thickness of the insulating layer BOX used in the first embodiment is 10-plus nm and is very thin, the TDDB life of the insulating layer BOX is significantly degraded if the high withstand voltage MISFETs 4Qn and 4Qp are formed on the SOI substrate 10. Furthermore, when the back bias potential is also used, the insulation resistance of the insulating layer BOX cannot be maintained. Therefore, the high withstand voltage MISFETs 4Qn and 4Qp are preferably formed in the bulk region.

Since main features of the first embodiment are in the low withstand voltage MISFET 1Q and the high withstand voltage MISFET 2Q formed on the SOI substrate 10, structures and manufacturing methods thereof will be mainly described in the following description.

As illustrated in FIG. 1, each of the low withstand voltage MISFET 1Q and the high withstand voltage MISFET 2Q is formed on the SOI substrate 10. The SOI substrate 10 includes a semiconductor substrate SUB serving as a support substrate, an insulating layer BOX formed on the semiconductor substrate SUB, and a semiconductor layer SL formed on the insulating layer BOX.

The semiconductor substrate SUB is made of, for example, p-type single crystal silicon. The insulating layer BOX is made of, for example, silicon oxide. A thickness of the insulating layer BOX is, for example, 10 nm or more and 20 nm or less. The semiconductor layer SL is made of single crystal silicon. A thickness of the semiconductor layer SL is, for example, 10 nm or more and 20 nm or less. Note that the semiconductor layer SL is an intrinsic semiconductor layer into which n-type or p-type impurities are not introduced by ion implantation or the like. Even if p-type impurities are introduced into the semiconductor layer SL, the impurity concentration thereof is $1\times10^{13}/cm^3$ or less.

A plurality of element isolation portions STI is formed in the SOI substrate 10. Each of the element isolation portions STI penetrates the semiconductor layer SL and the insulating layer BOX. A bottom portion of the element isolation portion STI is located inside the semiconductor substrate SUB. The element isolation portion STI is composed of a trench formed in the SOI substrate 10 and an insulating film embedded in the trench. The insulating film is, for example, a silicon oxide film.

In the semiconductor substrate SUB in the region 1A and the region 2A, an n-type well region DNW is formed. In the well region DNW in the region 1A, a p-type well region PW1 is formed. In the well region DNW in the region 2A, a p-type well region PW2 is formed. The element isolation portion STI and the well region DNW are formed between the well region PW1 and the well region PW2, and the well region PW1 and the well region PW2 are electrically isolated.

In the region 1A and the region 2A, the bulk region from which the semiconductor layer SL and the insulating layer BOX have been removed is provided. The bulk region in the region 1A functions as a power supply region SR1 for supplying a back gate potential to the well region PW1. The bulk region in the region 2A functions as a power supply region SR2 for supplying a back gate potential to the well region PW2.

Although described in detail later, the back gate potential may not be used in the high withstand voltage MISFET 2Q. Namely, the well region PW2 formed in the region 2A may be set in an electrically floating state. In that case, the bulk region (power supply region SR2) may not be provided in the region 2A. As a result, an area of the region 2A can be reduced, and the semiconductor device can be downsized.

Furthermore, the surface and its vicinity of each of the well region PW1 and the well region PW2 in contact with the insulating layer BOX are a region having the highest impurity concentration in the well region PW1 and the well region PW2, and is referred to as a ground plane layer, but illustration of the ground plane layer is omitted here.

<Low Withstand Voltage MISFET 1Q in Region 1A>

A gate insulating film GI1 is formed on the semiconductor layer SL in the region 1A. A gate electrode GE1 is formed on the gate insulating film GI1. The gate insulating film GI1 is, for example, a silicon oxide film. The gate electrode GE1 is a conductive film, for example, a polycrystalline silicon film into which n-type impurities are introduced. In the semiconductor layer SL, a portion located immediately below the gate electrode GE1 serves as a channel region of the low withstand voltage MISFET 1Q.

On a side surface of the gate electrode GE1, a sidewall spacer SW2 is formed via an offset spacer OS. The offset spacer OS is an insulating film, for example, a silicon oxide film. The sidewall spacer SW2 is an insulating film, for example, a silicon nitride film.

In the semiconductor layer SL located beside the gate electrode GE1, a low-concentration n-type impurity region LDD1 is formed. Note that the "semiconductor layer SL located beside the gate electrode GE1" is a portion of the semiconductor layer SL located next to a portion (a portion to be a channel region) located immediately below the gate electrode GE1. In other words, the impurity region LDD1 is formed in a portion of the semiconductor layer SL immediately below the offset spacer OS and the sidewall spacer SW2.

An epitaxial layer EP is formed on the semiconductor layer SL located beside the sidewall spacer SW2. Note that the "semiconductor layer SL located beside the sidewall spacer SW2" is a portion of the semiconductor layer SL located next to the impurity region LDD1. In the epitaxial layer EP and the semiconductor layer SL, an n-type diffusion region (impurity region) ND1 is formed. Namely, the epitaxial layer EP and the diffusion region ND1 are formed at positions farther from the gate electrode GE1 than the impurity region LDD1 is. The diffusion region ND1 has an impurity concentration higher than that of the impurity region LDD1. The impurity region LDD1 and the diffusion region ND1 constitute a source region or a drain region of the low withstand voltage MISFET 1Q.

Although the semiconductor layer SL and the epitaxial layer EP are actually integrated, these layers are illustrated so as to be separated by broken lines for easy understanding of the description.

A silicide film SI is formed on the gate electrode GE1 and the epitaxial layer EP. The silicide film SI is made of, for example, nickel platinum silicide, nickel silicide, or cobalt silicide. Furthermore, the silicide film SI is also formed on an upper surface of the well region PW1 serving as the power supply region SR1.

Note that the other sidewall spacer SW2 is also formed on the element isolation portion STI and covers the side surface of the semiconductor layer SL. Furthermore, the sidewall spacer SW2 rides on a part of the epitaxial layer EP, and the silicide film SI is formed at a portion exposed from the sidewall spacer SW2 and the offset spacer OS.

<High Withstand Voltage MISFET 2Q in Region 2A>

A gate insulating film GI2 is formed on the semiconductor layer SL in the region 2A. A gate electrode GE2 is formed on the gate insulating film GI2. The gate insulating film GI2 is, for example, a silicon oxide film. The gate electrode GE2 is a conductive film, for example, a polycrystalline silicon film into which n-type impurities are introduced. In the semiconductor layer SL, a portion located immediately below the gate electrode GE2 serves as a channel region of the high withstand voltage MISFET 2Q.

On a side surface of the gate electrode GE2, the sidewall spacer SW2 is formed via the offset spacer OS. In the semiconductor layer SL located beside the gate electrode GE2, a low-concentration n-type impurity region LDD2 is formed. Note that the "semiconductor layer SL located beside the gate electrode GE2" is a portion of the semiconductor layer SL located next to a portion (a portion to be a channel region) located immediately below the gate electrode GE2. In other words, the impurity region LDD2 is formed in a portion of the semiconductor layer SL immediately below the offset spacer OS and the sidewall spacer SW2.

An epitaxial layer EP is formed on the semiconductor layer SL located beside the sidewall spacer SW2. Note that the "semiconductor layer SL located beside the sidewall spacer SW2" is a portion of the semiconductor layer SL located next to the impurity region LDD2. In the epitaxial layer EP and the semiconductor layer SL, an n-type diffusion region (impurity region) ND2 is formed. Namely, the epitaxial layer EP and the diffusion region ND2 are formed at positions farther from the gate electrode GE2 than the impurity region LDD2 is. The diffusion region ND2 has an impurity concentration higher than that of the impurity region LDD2. The impurity region LDD2 and the diffusion region ND2 constitute a source region or a drain region of the high withstand voltage MISFET 2Q.

A silicide film SI is formed on the gate electrode GE2 and the epitaxial layer EP. Furthermore, the silicide film SI is also formed on an upper surface of the well region PW2 serving as the power supply region SR2.

<High Withstand Voltage MISFETs 4Qn and 4Qp in Region 4A>

As illustrated in FIG. 2, the region 4A is a bulk region from which the semiconductor layer SL and the insulating layer BOX have been removed. The n-type high withstand voltage MISFET 4Qn and the p-type high withstand voltage MISFET 4Qp are formed on the semiconductor substrate SUB in the region 4A.

In the semiconductor substrate SUB in the region 4A, an n-type well region DNW is formed. In the well region DNW in the region 4A, a p-type well region PW4 and an n-type well region NW4 are formed.

On the well region PW4, a gate electrode GE4*n* is formed via a gate insulating film GI4. The gate insulating film GI4 is, for example, a silicon oxide film. The gate electrode GE4*n* is a conductive film, for example, a polycrystalline silicon film into which n-type impurities are introduced. In the well region PW4, a portion located below the gate electrode GE4*n* serves as a channel region of the high withstand voltage MISFET 4Qn.

On a side surface of the gate electrode GE4*n*, the sidewall spacer SW2 is formed via the offset spacer OS. A low-concentration n-type impurity region LDD4*n* is formed in the well region PW4 located beside the gate electrode GE4*n*. An n-type diffusion region (impurity region) ND4 is formed in the well region PW4 located beside the sidewall spacer SW2. The diffusion region ND4 has an impurity concentration higher than that of the impurity region LDD4*n*. The impurity region LDD4*n* and the diffusion region ND4 constitute a source region or a drain region of the high withstand voltage MISFET 4Qn.

On the well region NW4, a gate electrode GE4*p* is formed via the gate insulating film GI4. The gate electrode GE4*p* is a conductive film, for example, a polycrystalline silicon film into which p-type impurities are introduced. In the well region NW4, a portion located below the gate electrode GE4*p* serves as a channel region of the high withstand voltage MISFET 4Qp.

On a side surface of the gate electrode GE4*p*, the sidewall spacer SW2 is formed via the offset spacer OS. In the well region NW4 located beside the gate electrode GE4*p*, a low-concentration p-type impurity region LDD4*p* is formed. A p-type diffusion region (impurity region) PD4 is formed in the well region NW4 located beside the sidewall spacer SW2. The diffusion region PD4 has an impurity concentration higher than that of the impurity region LDD4*p*. The impurity region LDD4*p* and the diffusion region PD4 constitute a source region or a drain region of the high withstand voltage MISFET 4Qp.

The silicide film SI is formed on an upper surface of each of the gate electrode GE4*n*, the diffusion region ND4, the gate electrode GE4*p*, and the diffusion region PD4.

Main Features of First Embodiment

The low withstand voltage MISFET 1Q is a semiconductor element having the thinnest gate insulating film in the semiconductor device, and is a semiconductor element whose gate length is shortest in the semiconductor device. The high withstand voltage MISFET 2Q is a semiconductor element whose gate insulating film is thicker than that of the low withstand voltage MISFET 1Q, and is a semiconductor element whose gate length is longer than that of the low withstand voltage MISFET 1Q. Note that each of the high withstand voltage MISFETs 4Qn and 4Qp is a semiconductor element whose gate insulating film is thicker than that of the high withstand voltage MISFET 2Q, and is a semiconductor element whose gate length is longer than that of the high withstand voltage MISFET 2Q.

Figure 3:
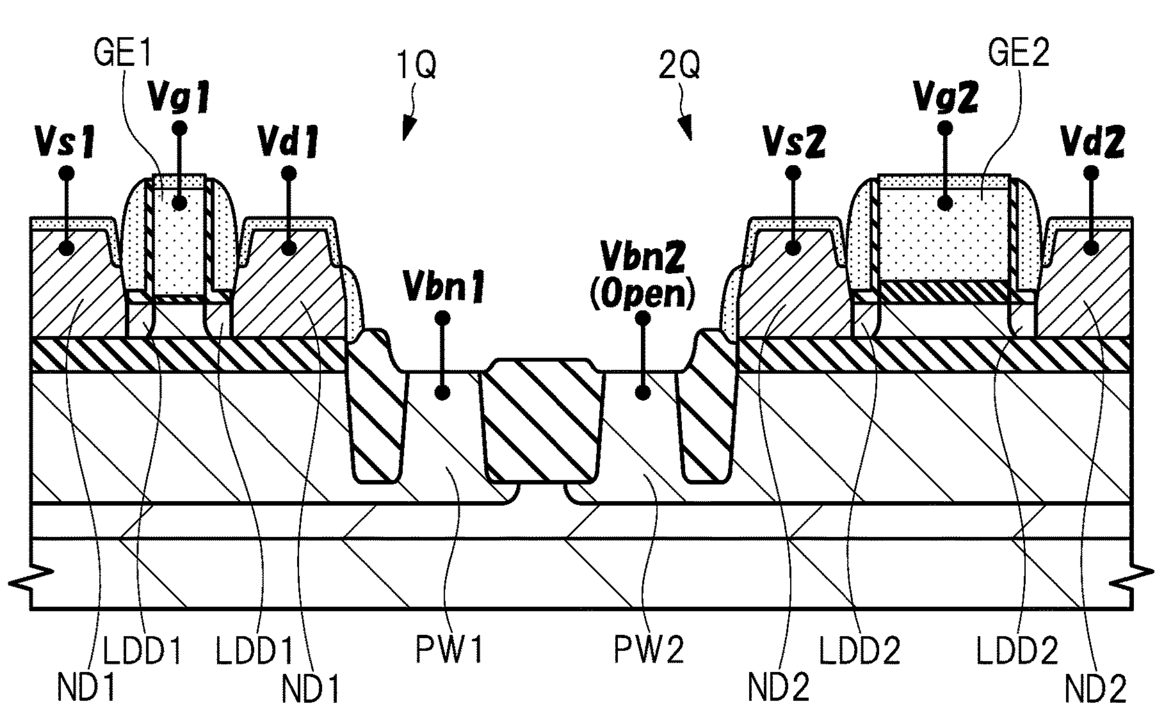
FIG. 3 is a schematic diagram illustrating a potential relationship of each of a low withstand voltage MISFET and a high withstand voltage MISFET according to the first embodiment and a table showing main design values of these MISFETs.

As illustrated in FIG. 3, a thickness of the gate insulating film GI1 is, for example, 1.5 nm or more and 3.0 nm or less, and preferably 2.5 nm. A thickness of the gate insulating film GI2 is larger than the thickness of the gate insulating film GI1, for example, 4.0 nm or more and 8.0 nm or less, and preferably 6.0 nm.

A gate length of the gate electrode GE1 is, for example, 30 nm or more and 60 nm or less, and preferably 40 nm or 45 nm. A gate length of the gate electrode GE2 is longer than the gate length of the gate electrode GE1, for example, 200 nm or more and 300 nm or less, and preferably 250 nm.

During the ON operation and the OFF operation of the low withstand voltage MISFET 1Q, a gate potential Vg1 is supplied to the gate electrode GE1, a source potential Vs1 is supplied to the source region, a power supply potential Vd1 is supplied to the drain region, and a back gate potential Vbn1 is supplied to the well region PW1. Note that each of the source region and the drain region of the low withstand voltage MISFET 1Q is composed of the impurity region LDD1 and the diffusion region ND1. Furthermore, the source potential Vs1 is, for example, a ground potential (GND).

During the ON operation and the OFF operation of the high withstand voltage MISFET 2Q, a gate potential Vg2 is supplied to the gate electrode GE2, a source potential Vs2 is supplied to the source region, and a power supply potential Vd2 is supplied to the drain region. Note that each of the source region and the drain region of the high withstand voltage MISFET 2Q is composed of the impurity region LDD2 and the diffusion region ND2. Furthermore, the source potential Vs2 is, for example, a ground potential (GND).

In the high withstand voltage MISFET 2Q, it is also possible to supply a back gate potential Vbn2 to the well region PW2, but no potential is supplied to the well region PW2 (Open) in the first embodiment. In other words, the well region PW2 is in an electrically floating state.

Specifically, the ON operation and the OFF operation of the low withstand voltage MISFET 1Q are controlled by the gate potential Vg1 and the back gate potential Vbn1. On the other hand, the ON operation and the OFF operation of the high withstand voltage MISFET 2Q are controlled by the gate potential Vg2, but are not controlled by the back gate potential.

Furthermore, the high withstand voltage MISFET 2Q operates at a higher power supply potential than the low withstand voltage MISFET 1Q. An absolute value of the power supply potential Vd2 is larger than an absolute value of the power supply potential Vd1. During the ON operation, the power supply potential Vd2 is, for example, 1.8 V, and the power supply potential Vd1 is, for example, 0.79 V. Moreover, each of the high withstand voltage MISFETs 4Qn and 4Qp operates at a higher power supply potential than the high withstand voltage MISFET 2Q. An absolute value of the power supply potential to be supplied to the drain region of each of the high withstand voltage MISFETs 4Qn and 4Qp is larger than an absolute value of the power supply potential Vd2, and is, for example, 3.3 V.

Here, the study by the inventors of this application has revealed that the TDDB life of the insulating layer BOX of the high withstand voltage MISFET 2Q is likely to be degraded if the gate potential Vg2 and the back gate potential Vbn2 are used for the ON operation and the OFF operation of the high withstand voltage MISFET 2Q. This is because the power supply potential Vd2 of the high withstand voltage MISFET 2Q is high.

Specifically, although the insulating layers BOX having the same thickness are used in the low withstand voltage MISFET 1Q and the high withstand voltage MISFET 2Q, the higher voltage is applied to the insulating layer BOX of the high withstand voltage MISFET 2Q because the power supply potential Vd2 is high in the high withstand voltage MISFET 2Q. Therefore, there is a problem that the TDDB life of the insulating layer BOX of the high withstand voltage MISFET 2Q is likely to be degraded and the reliability of the semiconductor device is lowered.

Therefore, in the first embodiment, the back gate potential Vbn2 is not supplied to the well region PW2 (power supply region SR2) of the high withstand voltage MISFET 2Q. In this way, the degradation of the TDDB life of the insulating layer BOX of the high withstand voltage MISFET 2Q can be suppressed, so that the reliability of the semiconductor device can be improved.

On the other hand, although the power supply potential Vd1 of the low withstand voltage MISFET 1Q is relatively low, the TDDB life of the insulating layer BOX may be degraded even in the low withstand voltage MISFET 1Q because the back gate potential Vbn1 is used.

As a result of the study by the inventors of this application, it has been found that the TDDB life of the insulating layer BOX varies by changing the energy of ion implantation and varying the damage amount of the ion implantation into the insulating layer BOX. In the first embodiment, the energy of ion implantation of the diffusion regions ND1 and ND2 is lower than that in the related art, and the ion implantation is performed under the conditions shown in FIG. 3. As a result, the degradation of the TDDB life of the insulating layer BOX of each of the low withstand voltage MISFET 1Q and the high withstand voltage MISFET 2Q can be suppressed.

Furthermore, in the first embodiment, the energy of ion implantation of the impurity region LDD1 is also lower than that in the related art, and the ion implantation is performed under the conditions shown in FIG. 3. Moreover, the energy of the ion implantation of the impurity region LDD1 is lower than the energy of the ion implantation of the impurity region LDD2. As a result, the degradation of the TDDB life of the insulating layer BOX of the low withstand voltage MISFET 1Q can be further suppressed.

In a case where the back gate potential Vbn2 is used in the high withstand voltage MISFET 2Q, from the viewpoint of further suppressing the degradation of the TDDB life of the high withstand voltage MISFET 2Q, the energy of the ion implantation of the impurity region LDD2 is preferably set to the same level as the energy of the ion implantation of the impurity region LDD1. However, in the high withstand voltage MISFET 2Q of the first embodiment, the degradation of the TDDB life of the insulating layer BOX can be suppressed by not using the back gate potential Vbn2 as described above.

Also, since the high withstand voltage MISFET 2Q is driven at the power supply potential Vd2 higher than that of the low withstand voltage MISFET 1Q, a problem tends to be more remarkable in the high withstand voltage MISFET 2Q than in the low withstand voltage MISFET 1Q. For example, since a high electric field is generated in the vicinity of the drain region in the high withstand voltage MISFET 2Q, the deterioration of the gate insulating film GI2 over time due to hot carrier injection tends to be a problem.

Therefore, in the first embodiment, the energy of the ion implantation of the impurity region LDD2 is made higher than the energy of the ion implantation of the impurity region LDD1. In this way, an impurity concentration peak of the impurity region LDD2 is brought close to the insulating layer BOX and away from the gate insulating film GI2. Preferably, the ion implantation is set such that a position of the impurity concentration peak of the impurity region LDD2 is located in the insulating layer BOX.

Since a portion where a high electric field is likely to be generated, that is, a portion where hot carriers are likely to be generated is brought away from the gate insulating film GI2, hot carriers are less likely to be injected into the gate insulating film GI2. Therefore, the deterioration of the gate insulating film GI2 over time is suppressed.

Figure 4:
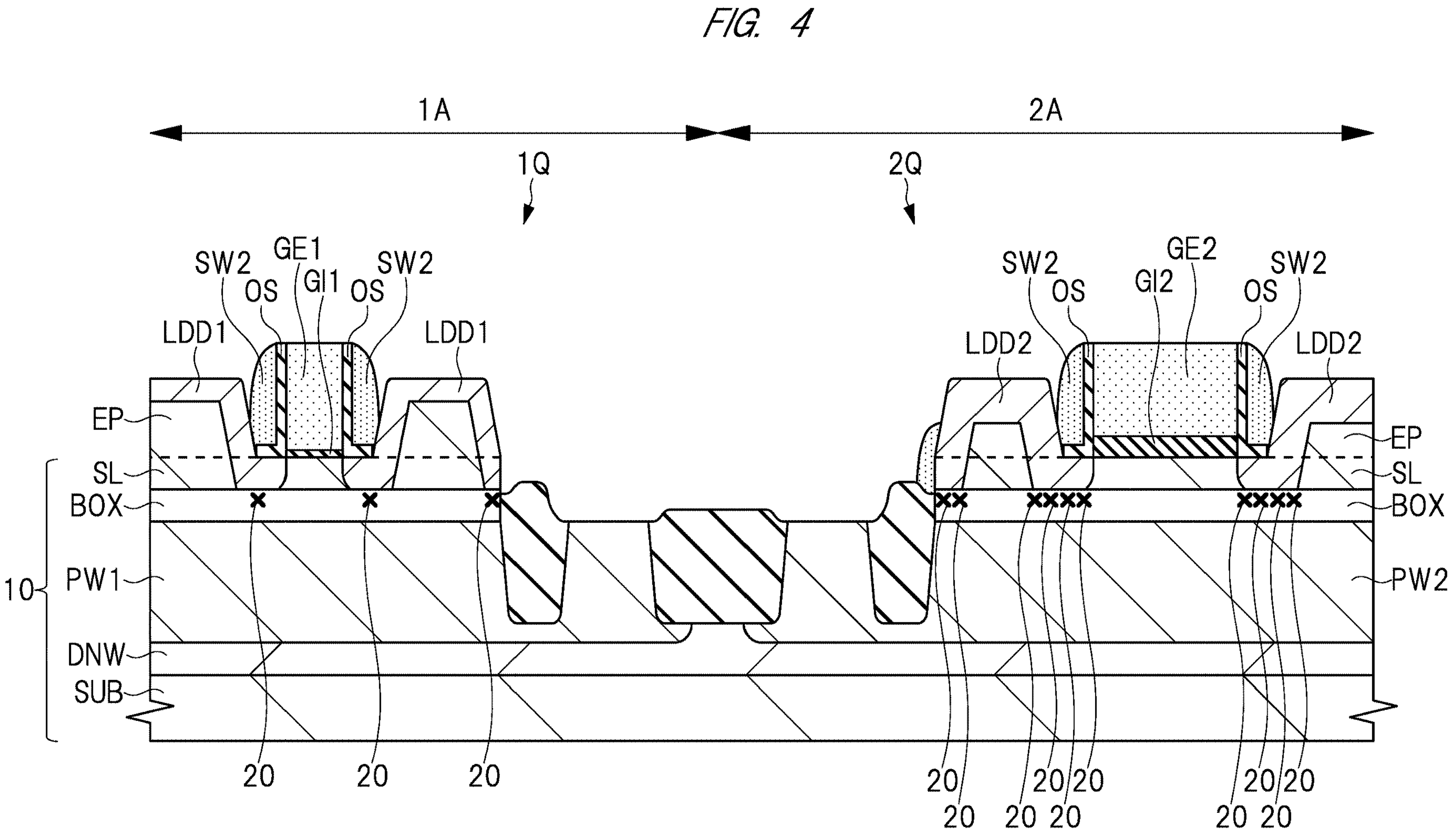
FIG. 4 is a cross-sectional view illustrating main features of the semiconductor device according to the first embodiment.

FIG. 4 is substantially the same cross-sectional view as FIG. 1, but some configurations such as the diffusion regions ND1 and ND2 are omitted in FIG. 4 such that the formation positions of the impurity regions LDD1 and LDD2 can be easily understood. Damaged layers 20 illustrated in FIG. 4 indicate damages in the insulating layer BOX caused by the ion implantation of the impurity regions LDD1 and LDD2. Specifically, the damaged layer 20 is a portion where atoms constituting the insulating layer BOX are partially lost. In a case where the insulating layer BOX is made of a silicon oxide film, the damaged layer 20 is a portion where silicon atoms (Si) or oxygen atoms (O) or both of them are lost.

The energy of the ion implantation of the impurity region LDD2 is higher than the energy of the ion implantation of the impurity region LDD1, and the impurity concentration peak of the impurity region LDD2 is located closer to the insulating layer BOX than the impurity concentration peak of the impurity region LDD1 is, and is preferably located in the insulating layer BOX.

Therefore, as illustrated in FIG. 4, the amount of the damaged layer 20 present in the insulating layer BOX located below the impurity region LDD2 is larger than the amount of the damaged layer 20 present in the insulating layer BOX located below the impurity region LDD1.

As described above, in the semiconductor device according to the first embodiment, the degradation of the TDDB life of the insulating layer BOX can be suppressed in the low withstand voltage MISFET 1Q and the high withstand voltage MISFET 2Q, and the deterioration of the gate insulating film GI2 over time due to hot carrier injection can be suppressed in the high withstand voltage MISFET 2Q. Therefore, the reliability of the semiconductor device can be improved.

From the viewpoint of suppressing the leakage current and facilitating the driving with low power consumption, it is preferable to use the back gate potential Vbn2 also in the high withstand voltage MISFET 2Q. However, in the high withstand voltage MISFET 2Q, the gate length is sufficiently long and the thickness of the gate insulating film GI2 is sufficiently large as compared with the low withstand voltage MISFET 1Q. Therefore, since the influence of the leakage current and the like is smaller in the high withstand voltage MISFET 2Q than in the low withstand voltage MISFET 1Q, the high withstand voltage MISFET 2Q can be operated without deteriorating the performance of the high withstand voltage MISFET 2Q even if the back gate potential Vbn2 is not used. In the case of placing emphasis on the suppression of the degradation of the TDDB life of the insulating layer BOX as in the first embodiment, it is preferable not to use the back gate potential Vbn2.

Furthermore, although the n-type low withstand voltage MISFET 1Q and the n-type high withstand voltage MISFET 2Q are exemplified in the first embodiment, the p-type low withstand voltage MISFET is also formed on the SOI substrate 10 in the region 1A and the p-type high withstand voltage MISFET is also formed on the SOI substrate 10 in the region 2A as described above. The technology described in the first embodiment can also be applied to the p-type low withstand voltage MISFET and the p-type high withstand voltage MISFET, and equivalent effects can be obtained.

<Method of Manufacturing Semiconductor Device>

Each manufacturing step included in a method of manufacturing the semiconductor device according to the first embodiment will be described below with reference to FIG. 5 to FIG. 16.

Figure 5:
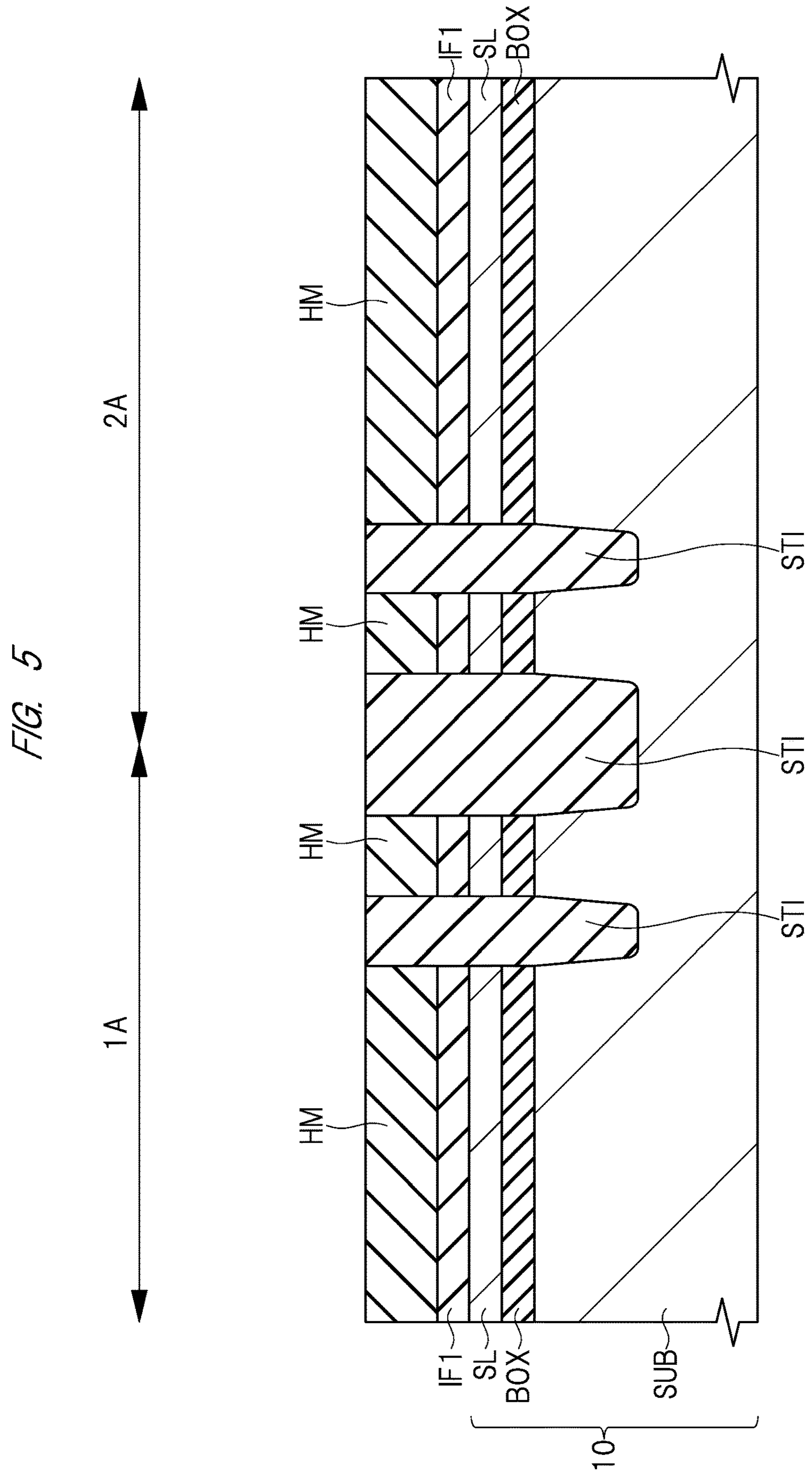
FIG. 5 is a cross-sectional view illustrating a manufacturing process of the semiconductor device according to the first embodiment.

As illustrated in FIG. 5, first, the SOI substrate 10 is prepared. An example of a step of preparing the SOI substrate 10 will be described below. The SOI substrate 10 can be manufactured by, for example, the bonding method. In the bonding method, first, a surface of a first semiconductor substrate made of silicon is oxidized to form the insulating layer BOX. Next, a second semiconductor substrate made of silicon is pressed and bonded onto the insulating layer BOX under a high temperature environment. Next, an upper surface of the second semiconductor substrate is thinned. The thin second semiconductor substrate remaining on the insulating layer BOX serves as the semiconductor layer SL, and the first semiconductor substrate below the insulating layer BOX serves as the semiconductor substrate SUB.

Next, an insulating film IF1 made of, for example, silicon oxide is formed on the semiconductor layer SL by, for example, the chemical vapor deposition (CVD) method. A thickness of the insulating film IF1 is, for example, 10 nm or more and 20 nm or less. Next, for example, a silicon nitride film is formed on the insulating film IF1 by, for example, the CVD method. A thickness of the silicon nitride film is, for example, 80 nm or more and 120 nm or less. Next, the silicon nitride film is patterned by the photolithography technique and the anisotropic etching process. As a result, a hard mask HM made of the silicon nitride film is formed.

Next, the anisotropic etching process using the hard mask HM as a mask is performed to form a plurality of trenches penetrating the insulating film IF1, the semiconductor layer SL, and the insulating layer BOX and reaching the inside of the semiconductor substrate SUB. Next, for example, a silicon oxide film is formed inside the plurality of trenches and on the hard mask HM by, for example, the CVD method. Next, the silicon oxide film formed on the hard mask HM is removed by the polishing process using, for example, the chemical mechanical polishing (CMP) method. In this way, a plurality of the element isolation portions STI is formed inside the plurality of trenches, respectively.

As illustrated in FIG. 6, first, an upper surface of the element isolation portion STI is retracted by the isotropic etching process using a solution containing hydrofluoric acid. Next, the hard mask HM is removed by the isotropic etching process using a solution containing phosphoric acid.

Next, the n-type well region DNW is formed in the semiconductor substrate SUB in the region 1A and the region 2A by using the photolithography technique and the ion implantation method. Next, by using the photolithography technique and the ion implantation method, the p-type well region PW1 is selectively formed in the well region DNW in the region 1A, and the p-type well region PW2 is selectively formed in the well region DNW in the region 2A.

Figure 7:
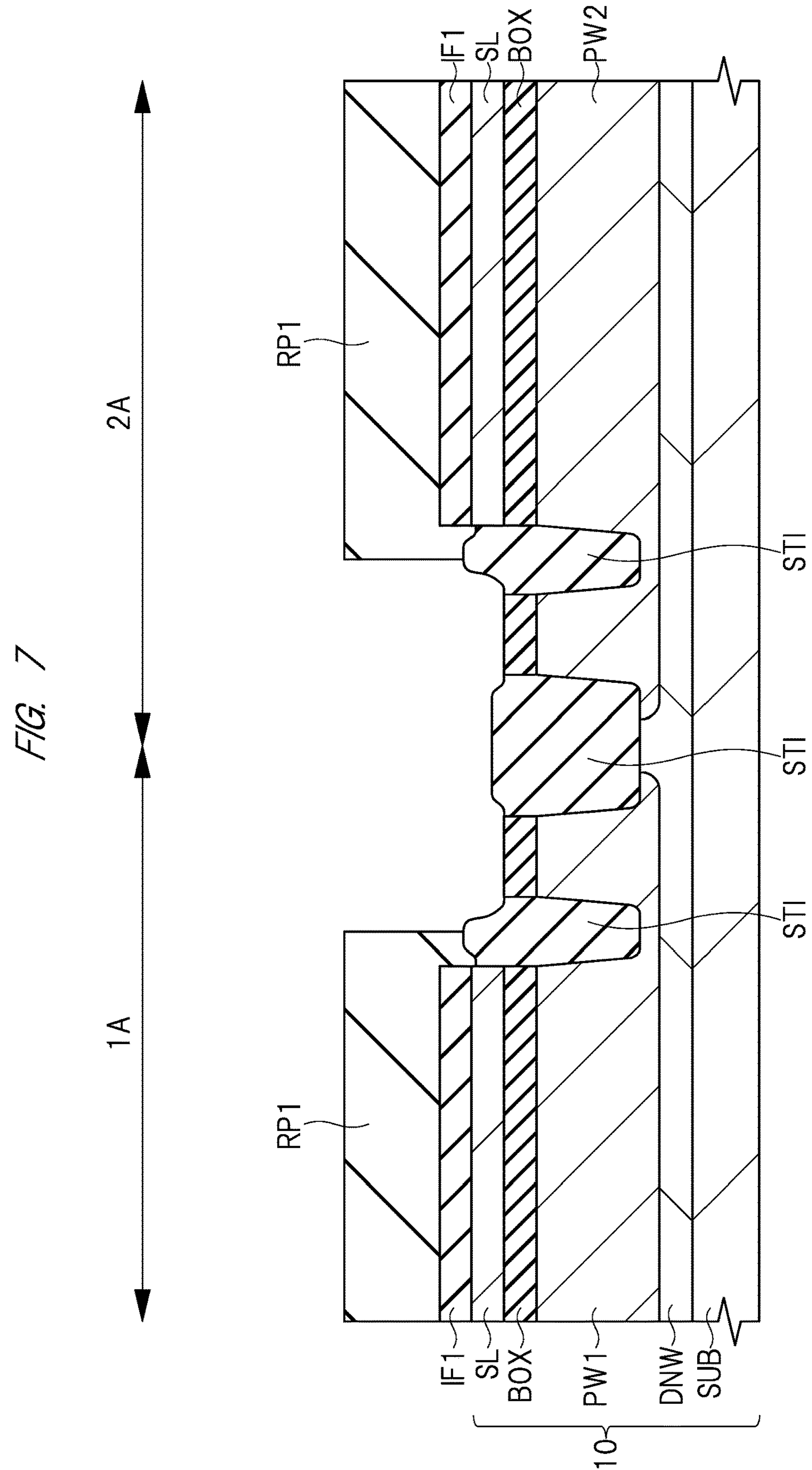
FIG. 7 is a cross-sectional view illustrating the manufacturing process of the semiconductor device subsequent to FIG. 6.

As illustrated in FIG. 7, first, a resist pattern RP1 is formed on the insulating film IF1 so as to selectively open a part of the region 1A and a part of the region 2A. Next, the isotropic etching process and the anisotropic etching process are performed using the resist pattern RP1 as a mask to sequentially remove the insulating film IF1 and the semiconductor layer SL exposed from the resist pattern RP1. Thereafter, the resist pattern RP1 is removed by the ashing process. In this state, in the region 1A and the region 2A, a part of the insulating layer BOX is exposed from the insulating film IF1.

As illustrated in FIG. 8, the insulating film IF1 and a part of the insulating layer BOX exposed from the insulating film IF1 are removed by the isotropic etching process using a solution containing hydrofluoric acid. In this way, the semiconductor substrate SUB is exposed in a part of the region 1A and a part of the region 2A. The exposed semiconductor substrate SUB serves as the power supply regions SR1 and SR2 (bulk regions). Note that a bulk region such as the region 4A is also formed in the manufacturing steps so far. Furthermore, in the manufacturing steps so far, the upper surface of a part of the element isolation portion STI exposed to the isotropic etching process is retracted.

Figure 9:
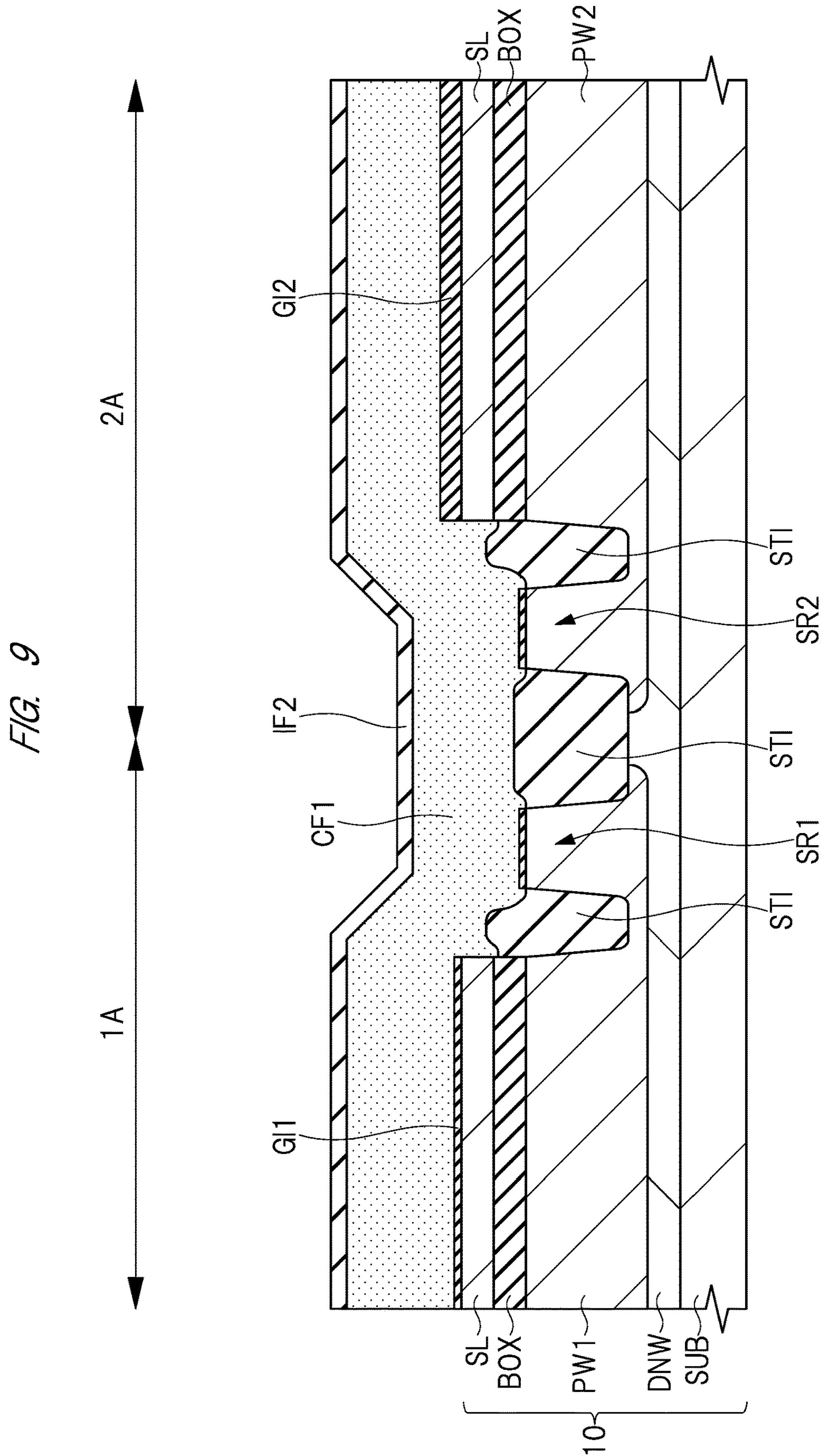
FIG. 9 is a cross-sectional view illustrating the manufacturing process of the semiconductor device subsequent to FIG. 8.

As illustrated in FIG. 9, first, a relatively thick silicon oxide film is formed on the semiconductor layer SL and the semiconductor substrate SUB by, for example, the thermal oxidation treatment. Next, the thick silicon oxide film is selectively removed by the photolithography technique and the isotropic etching process so as to leave the thick silicon oxide film on the semiconductor layer SL in the region 2A. Next, a relatively thin silicon oxide film is formed on the semiconductor layer SL and the semiconductor substrate SUB by, for example, the thermal oxidation treatment. Note that a thickness of the thick silicon oxide film in the region 2A is slightly increased by this thermal oxidation treatment.

The thin silicon oxide film on the semiconductor layer SL in the region 1A serves as the gate insulating film GI1 of the low withstand voltage MISFET 1Q, and the thick silicon oxide film on the semiconductor layer SL in the region 2A serves as the gate insulating film GI2 of the high withstand voltage MISFET 2Q.

Next, a conductive film CF1 made of, for example, a polycrystalline silicon film is formed on the gate insulating film GI1 and the gate insulating film GI2 by, for example, the CVD method. Next, impurities exhibiting n-type conductivity are selectively introduced into the conductive films CF1 in the region 1A and the region 2A by using the photolithography technique and the ion implantation method. Next, an insulating film IF2 made of, for example, a silicon nitride film is formed on the conductive film CF1 by, for example, the CVD method.

Figure 10:
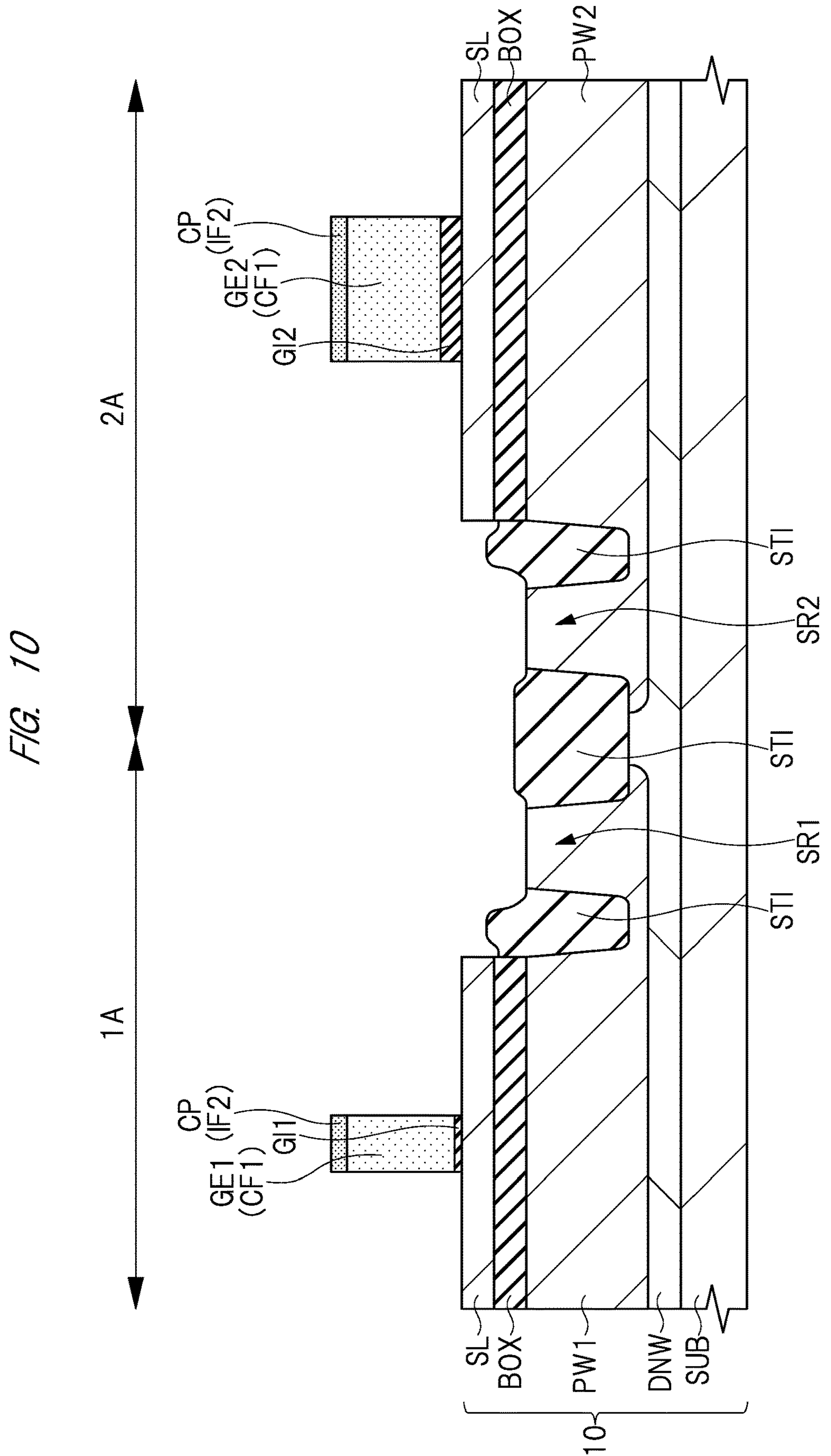
FIG. 10 is a cross-sectional view illustrating the manufacturing process of the semiconductor device subsequent to FIG. 9.

As illustrated in FIG. 10, the insulating film IF2 and the conductive film CF1 are sequentially patterned by the photolithography technique and the anisotropic etching process. As a result, the gate electrode GE1 and a cap film CP are formed on the gate insulating film GI1, and the gate electrode GE2 and a cap film CP are formed on the gate insulating film GI2. Thereafter, the gate insulating film GI1 and the gate insulating film GI2 exposed from the gate electrode GE1 and the gate electrode GE2 are removed by the isotropic etching process.

Figure 11:
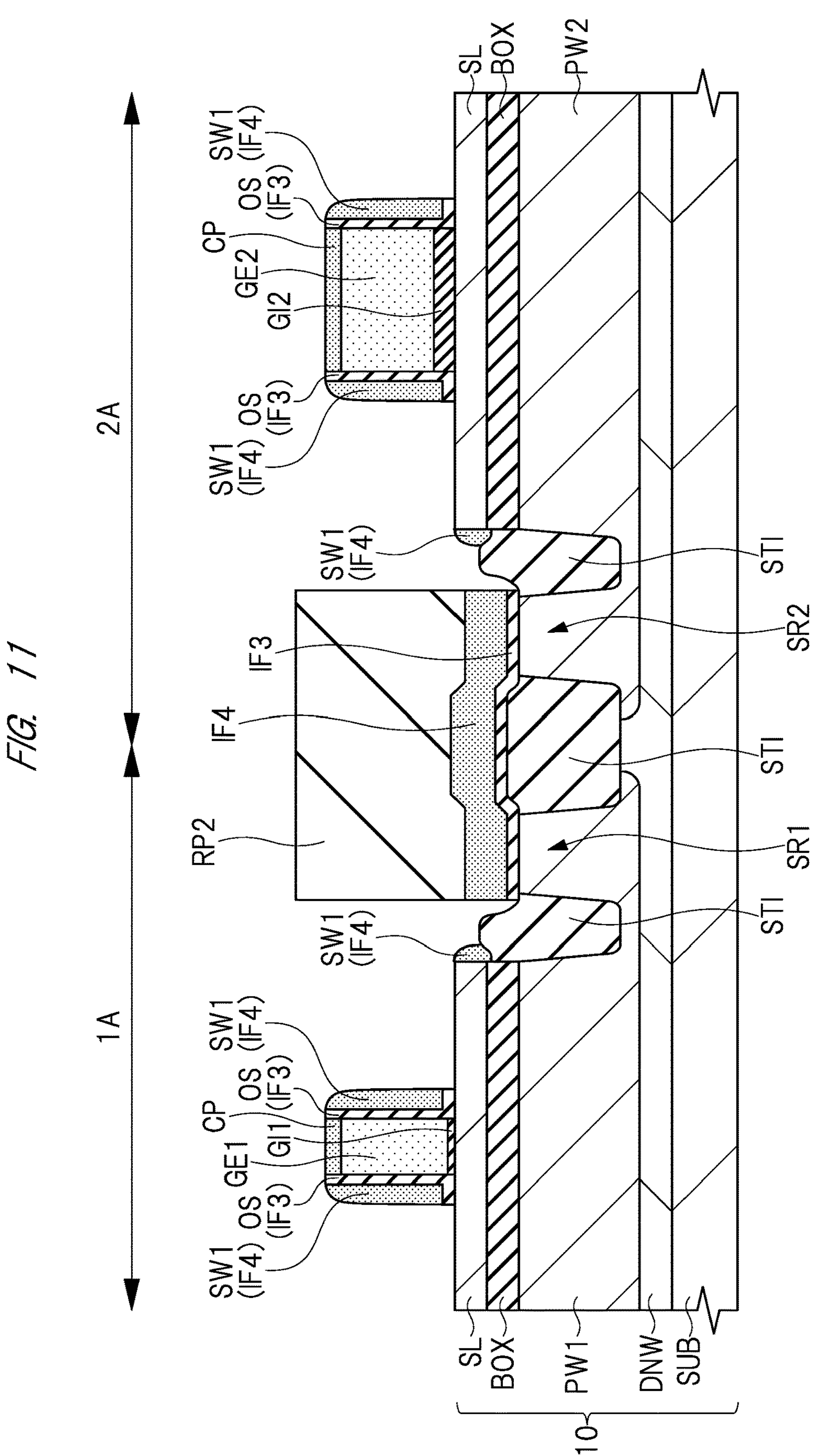
FIG. 11 is a cross-sectional view illustrating the manufacturing process of the semiconductor device subsequent to FIG. 10.

As illustrated in FIG. 11, first, an insulating film IF3 made of, for example, a silicon oxide film is formed on the semiconductor layer SL and the semiconductor substrate SUB by, for example, the CVD method so as to cover the gate electrodes GE1 and GE2 and the cap films CP. Next, an insulating film IF4 made of, for example, a silicon nitride film is formed on the insulating film IF3 by, for example, the CVD method.

Next, a resist pattern RP2 that selectively covers the power supply regions SR1 and SR2 is formed. Next, the anisotropic etching process using the resist pattern RP2 as a mask is performed on the insulating film IF4 and the insulating film IF3 to form the sidewall spacer SW1 and the offset spacer OS on the side surfaces of the gate electrode GE1 and the gate electrode GE2, respectively. Note that the sidewall spacer SW1 is formed on the side surface of each of the gate electrodes GE1 and GE2 via the offset spacer OS. Furthermore, the power supply regions SR1 and SR2 are covered with the insulating films IF4 and IF3. Thereafter, the resist pattern RP2 is removed by the ashing process.

Figure 12:
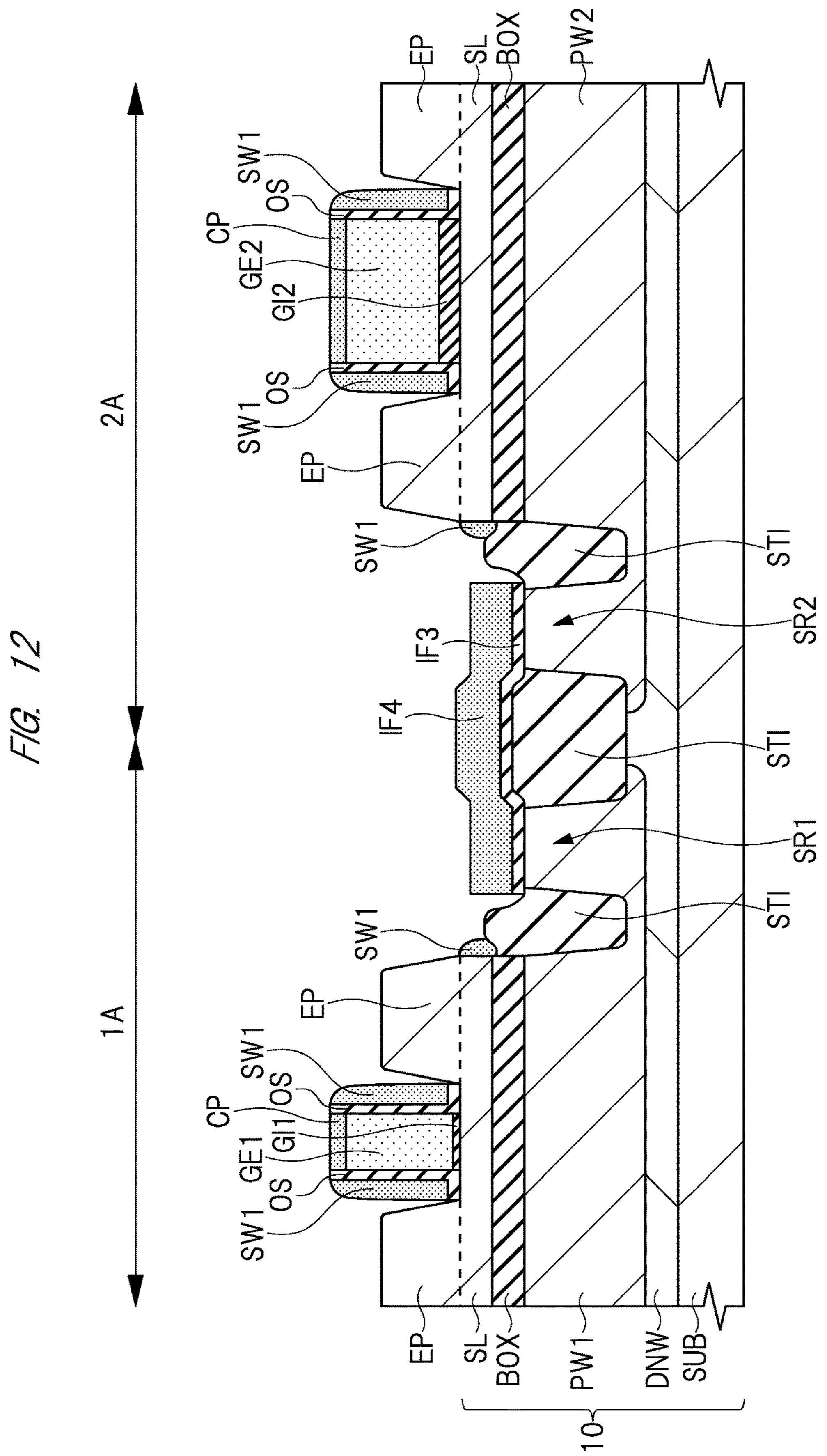
FIG. 12 is a cross-sectional view illustrating the manufacturing process of the semiconductor device subsequent to FIG. 11.

As illustrated in FIG. 12, the epitaxial layers (semiconductor layers) EP made of, for example, single crystal silicon are formed on the semiconductor layers SL in the region 1A and the region 2A by the epitaxial growth method. At this time, since an upper surface of each of the gate electrodes GE1 and GE2 is covered with the cap film CP, the epitaxial layer EP is not formed on the upper surface of each of the gate electrodes GE1 and GE2. Furthermore, since the power supply regions SR1 and SR2 are covered with the insulating film IF4, the epitaxial layer EP is not formed on the semiconductor substrate SUB of each of the power supply regions SR1 and SR2.

Figure 13:
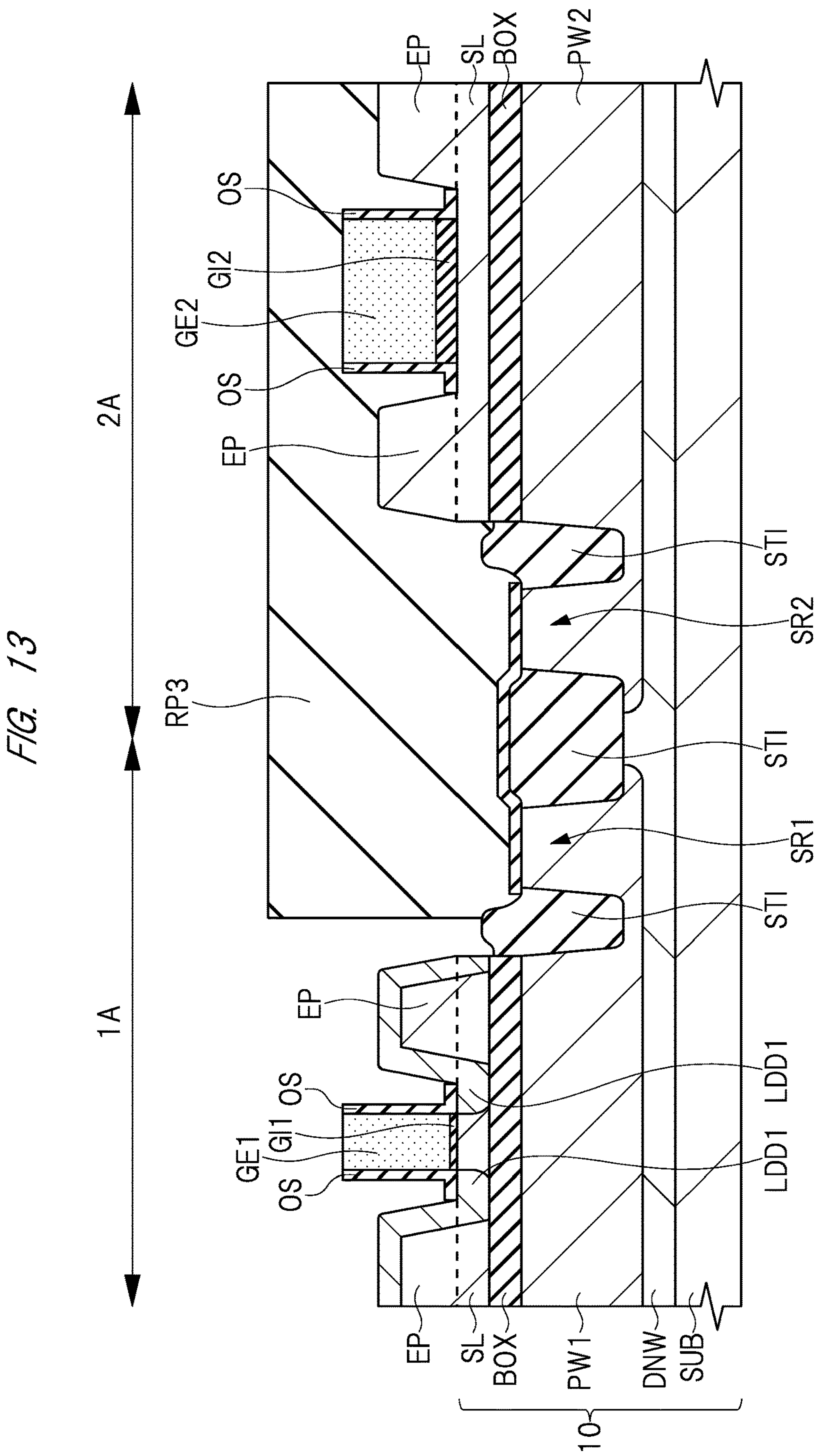
FIG. 13 is a cross-sectional view illustrating the manufacturing process of the semiconductor device subsequent to FIG. 12.

As illustrated in FIG. 13, first, the sidewall spacer SW1, the cap film CP, and the insulating film IF4 are removed by the isotropic etching process. Next, a resist pattern RP3 having a pattern selectively opening on the semiconductor layer SL in the region 1A is formed. Next, the ion implantation using the resist pattern RP3 as a mask is performed to form the n-type impurity region LDD1 in the semiconductor layer SL and the epitaxial layer EP in the region 1A. Thereafter, the resist pattern RP3 is removed by the ashing process.

The ion implantation in FIG. 13 is performed under the conditions shown in FIG. 3. Namely, the ion implantation of the impurity region LDD1 is performed using arsenic (As) under the conditions that the implantation energy is 5 keV or less and a dose amount is $3.0\times10^{14}/cm^2$. At this time, the ion implantation is set such that a position of the impurity concentration peak of the impurity region LDD1 is located in the semiconductor layer SL.

Note that, since the epitaxial layer EP is thick, ions do not reach the entire semiconductor layer SL located beside the gate electrode GE1 in the ion implantation mentioned above. Therefore, the impurity region LDD1 is formed in a part of the semiconductor layer SL in the region 1A.

Figure 14:
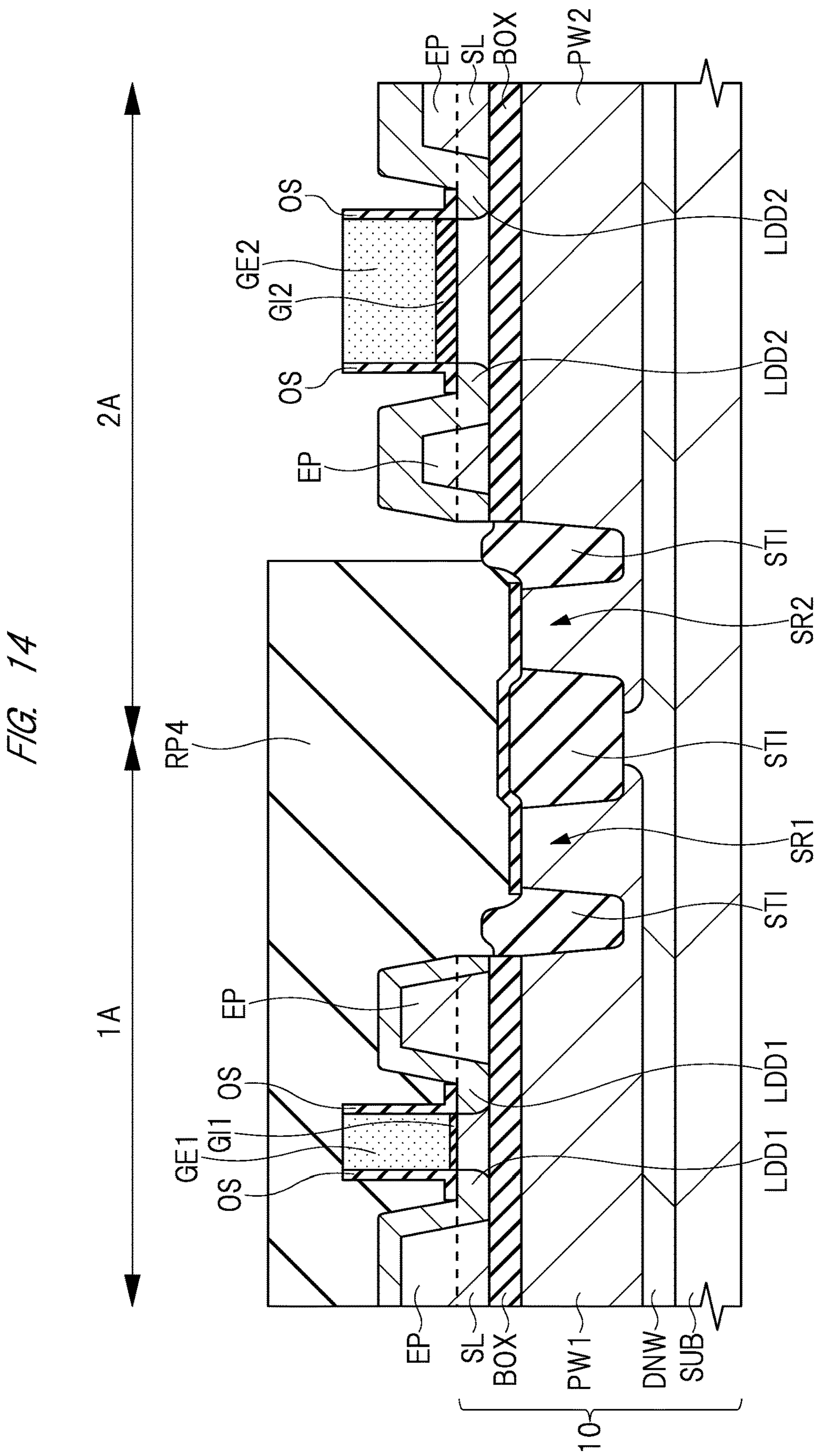
FIG. 14 is a cross-sectional view illustrating the manufacturing process of the semiconductor device subsequent to FIG. 13.

As illustrated in FIG. 14, first, a resist pattern RP4 having a pattern selectively opening on the semiconductor layer SL in the region 2A is formed. Next, the ion implantation using the resist pattern RP4 as a mask is performed to form the n-type impurity region LDD2 in the semiconductor layer SL and the epitaxial layer EP in the region 2A. Thereafter, the resist pattern RP4 is removed by the ashing process.

The ion implantation in FIG. 14 is performed under the conditions shown in FIG. 3. Here, a case where the ion implantation of the impurity region LDD2 is separately performed twice is exemplified, but the ion implantation of the impurity region LDD2 may be performed only by the second ion implantation. The first ion implantation is performed using arsenic (As) under the conditions that an implantation energy is 5 keV and a dose amount is $5.0\times10^{12}/cm^2$. The second ion implantation is performed using phosphorus (P) under the conditions that an implantation energy is 25 keV or more and a dose amount is $1.8\times10^{14}/cm^2$. At this time, the second ion implantation is set such that the impurity concentration peak of the impurity region LDD2 is located closer to the insulating layer BOX than the impurity concentration peak of the impurity region LDD1 is, and is preferably located in the insulating layer BOX.

As described with reference to FIG. 3 and FIG. 4, the energy of the ion implantation of the impurity region LDD2 is higher than the energy of the ion implantation of the impurity region LDD1. Therefore, the amount of the damaged layer 20 formed in the insulating layer BOX located immediately below the impurity region LDD2 by the ion implantation of FIG. 14 is larger than the amount of the damaged layer 20 formed in the insulating layer BOX located immediately below the impurity region LDD1 by the ion implantation of FIG. 13.

Note that, since the epitaxial layer EP is thick, ions do not reach the entire semiconductor layer SL located beside the gate electrode GE2 in the ion implantation mentioned above. Therefore, the impurity region LDD2 is formed in a part of the semiconductor layer SL in the region 2A.

Furthermore, the order of the ion implantation of the impurity region LDD1 and the ion implantation of the impurity region LDD2 is not particularly limited.

Figure 15:
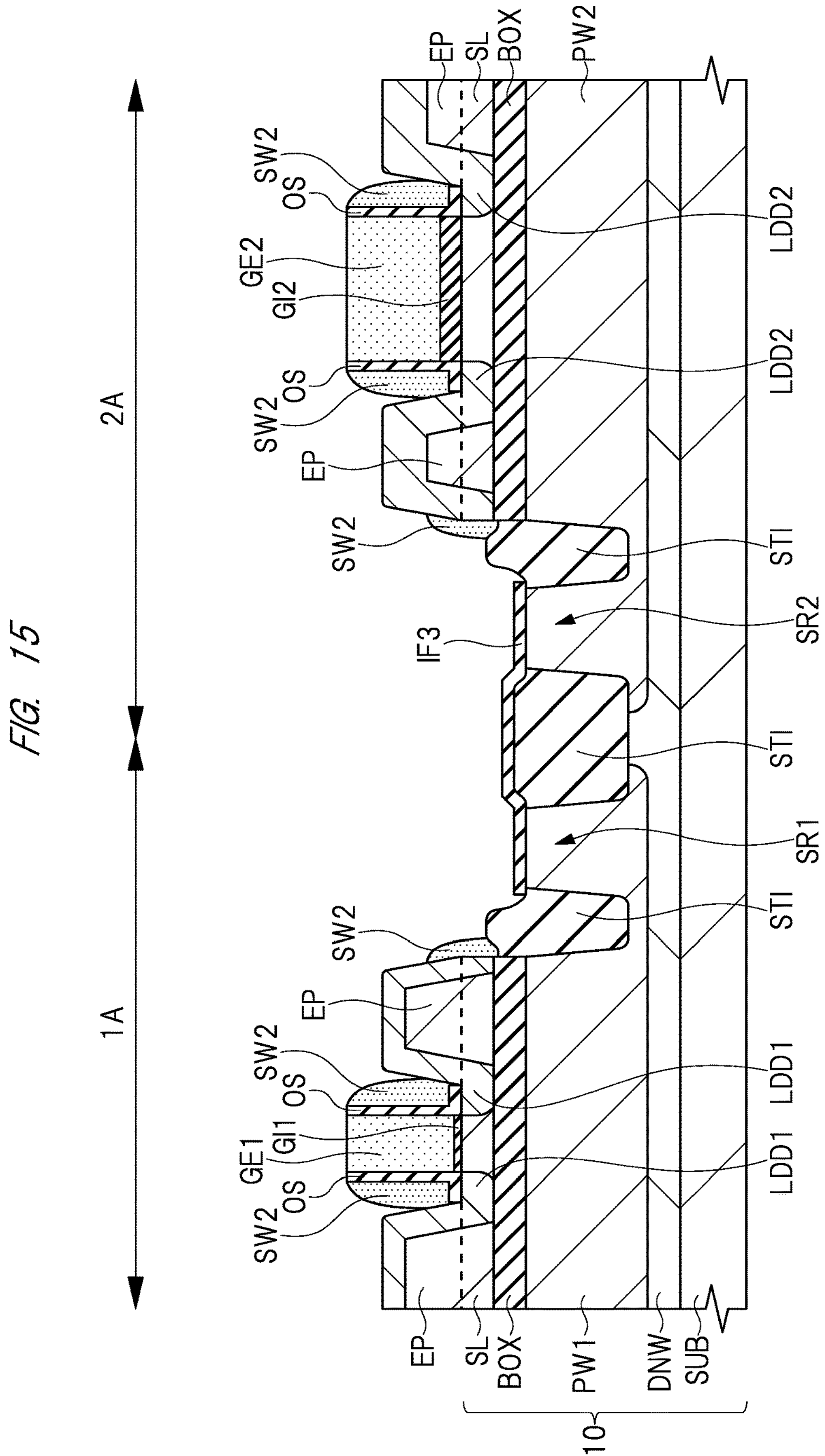
FIG. 15 is a cross-sectional view illustrating the manufacturing process of the semiconductor device subsequent to FIG. 14.

As illustrated in FIG. 15, first, for example, a silicon nitride film is formed so as to cover the gate electrodes GE1 and GE2 and the offset spacer OS. Next, the anisotropic etching process is performed on the silicon nitride film to form the sidewall spacer SW2 on the side surface of each of the gate electrodes GE1 and GE2 via the offset spacer OS. The sidewall spacer SW2 rides on a part of the epitaxial layer EP. Furthermore, the other sidewall spacer SW2 is also formed on the element isolation portion STI and covers the side surface of the semiconductor layer SL.

Figure 16:
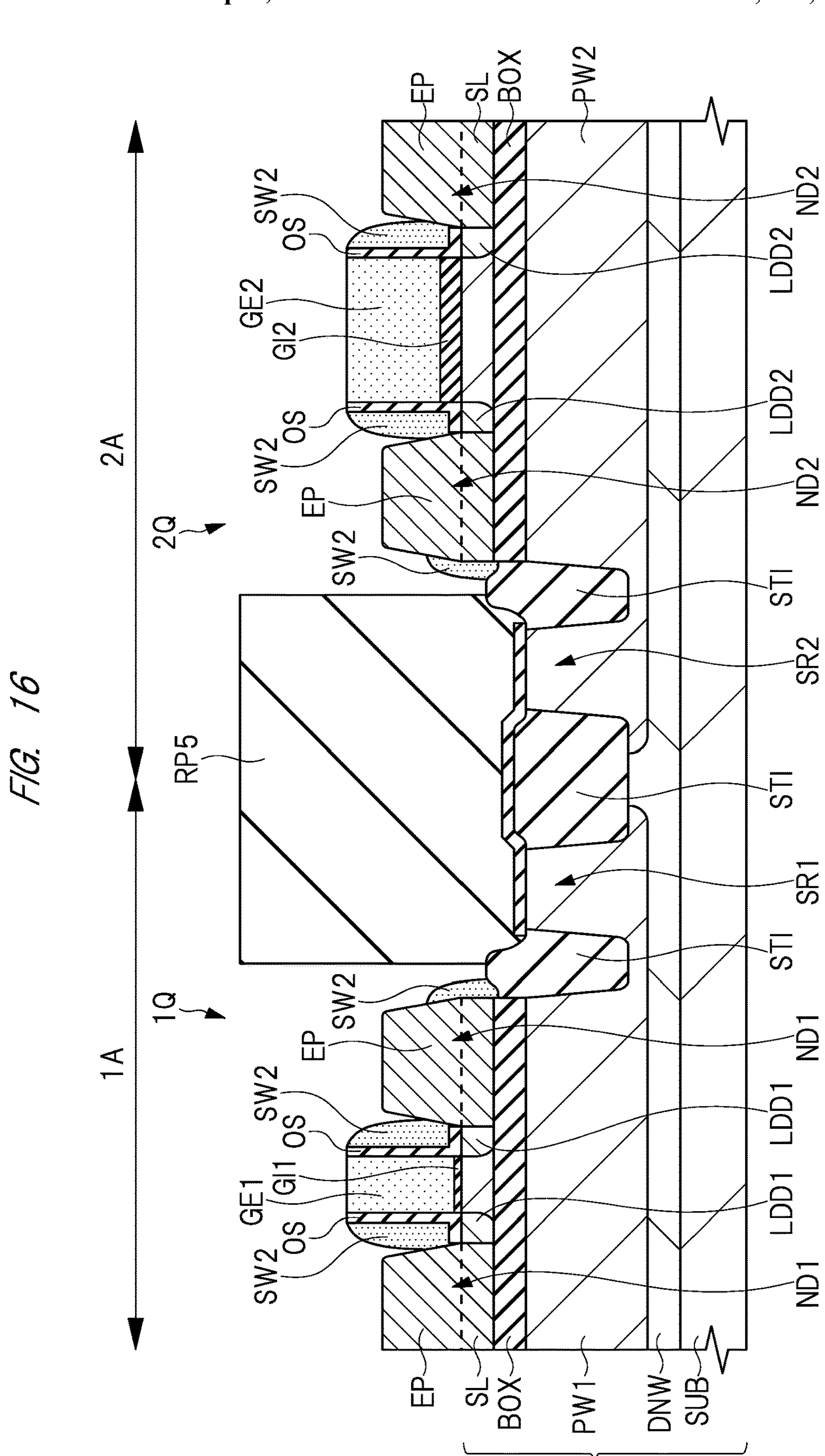
FIG. 16 is a cross-sectional view illustrating the manufacturing process of the semiconductor device subsequent to FIG. 15.

As illustrated in FIG. 16, first, a resist pattern RP5 covering the power supply regions SR1 and SR2 and having a pattern selectively opening on the semiconductor layer SL in the region 1A and the region 2A is formed. Next, the ion implantation using the resist pattern RP5 as a mask is performed to form the n-type diffusion regions ND1 and ND2 in the semiconductor layer SL and the epitaxial layer EP exposed from the sidewall spacer SW2 in the region 1A and the region 2A. Thereafter, the resist pattern RP5 is removed by the ashing process.

The ion implantation in FIG. 16 is performed under the conditions shown in FIG. 3. Here, a case where the ion implantation of the diffusion regions ND1 and ND2 is separately performed twice is exemplified, but the ion implantation of the diffusion regions ND1 and ND2 may be performed only by the second ion implantation. The first ion implantation is performed using arsenic (As) under the conditions that an implantation energy is 5 keV and a dose amount is $2.0\times10^{15}/cm^2$. The second ion implantation is performed using phosphorus (P) under the conditions that an implantation energy is 8 keV and a dose amount is $3.0\times10^{15}/cm^2$. At this time, the first and second ion implantations are set such that the positions of the impurity concentration peaks of the diffusion regions ND1 and ND2 are located in the epitaxial layer EP.

As described above, the low withstand voltage MISFET 1Q is formed in the region 1A and the high withstand voltage MISFET 2Q is formed in the region 2A.

Thereafter, the structure illustrated in FIG. 1 is obtained through the following manufacturing steps. First, the insulating film IF3 formed in the power supply regions SR1 and SR2 is removed by the isotropic etching process. Next, the silicide film SI is formed on upper surfaces of the gate electrodes GE1 and GE2, the epitaxial layer EP, the well region PW1 (power supply region SR1), and the well region PW2 (power supply region SR2) by the self aligned silicide (salicide) technique.

Second Embodiment

A semiconductor device according to a second embodiment will be described below with reference to FIG. 17 and FIG. 18. Note that, in the following description, differences from the first embodiment will be mainly described, and descriptions of the points overlapping with the first embodiment will be omitted.

Figure 17:
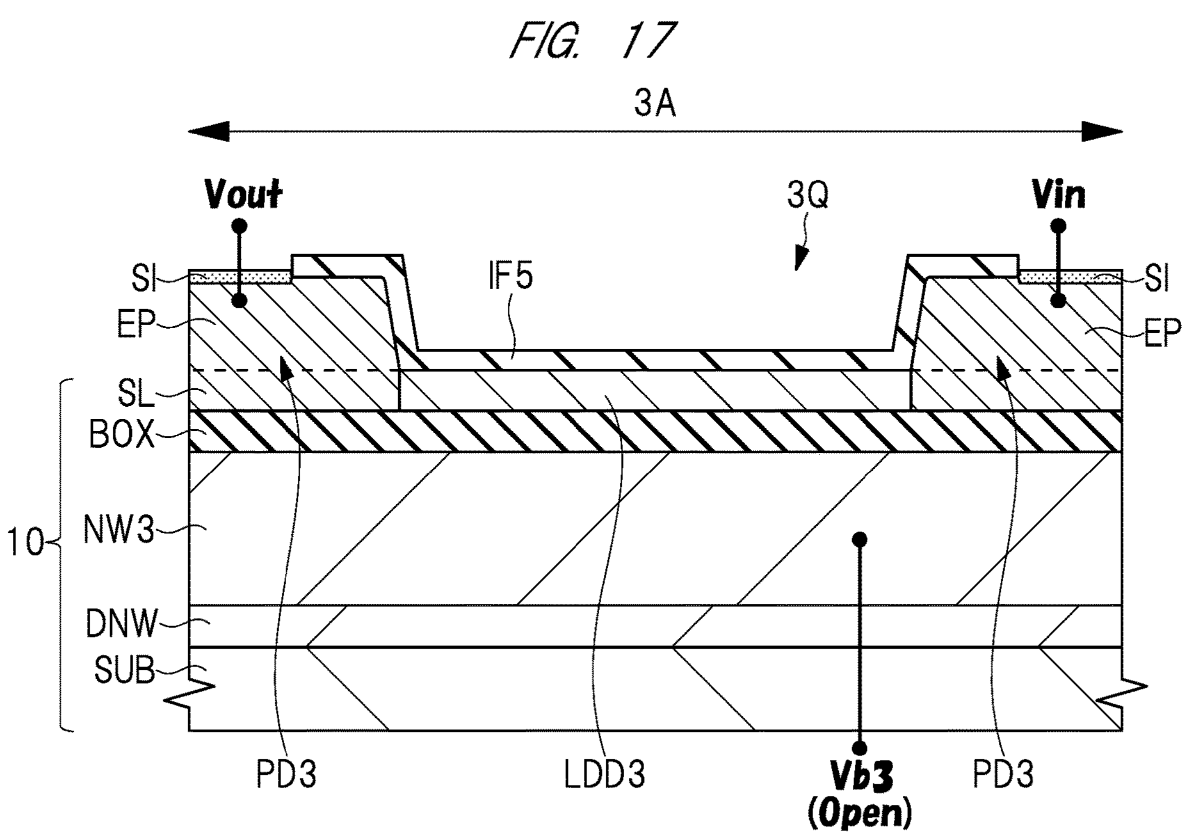
FIG. 17 is a cross-sectional view illustrating a semiconductor device according to a second embodiment.

As illustrated in FIG. 17, the semiconductor device according to the second embodiment has a region 3A that is different from the region 1A, the region 2A, and the region 4A. A resistance element 3Q is formed on the SOI substrate 10 in the region 3A. The resistance element 3Q is a semiconductor element used in an analog circuit or the like. The technology described in the first embodiment can also be applied to the resistance element 3Q.

In the semiconductor substrate SUB in the region 3A, the n-type well region DNW is formed. In the well region DNW in the region 3A, an n-type well region NW3 is formed.

In the semiconductor layer SL in the region 3A, a low-concentration p-type impurity region LDD3 is formed. The epitaxial layer EP is formed on the semiconductor layer SL in the region 3A. In the epitaxial layer EP and the semiconductor layer SL, a p-type diffusion region (impurity region) PD3 is formed. The diffusion region PD3 has an impurity concentration higher than that of the impurity region LDD3.

An insulating film IF5 is formed so as to cover a part of the epitaxial layer EP and the semiconductor layer SL in the region 3A. The insulating film IF5 is formed immediately before the step of forming the silicide film SI, and is provided to protect a region where the silicide film SI is not desired to be formed. The insulating film IF5 is, for example, a silicon oxide film. The silicide film SI is formed on the epitaxial layer EP exposed from the insulating film IF5.

A portion of the semiconductor layer SL where the impurity region LDD3 is formed is a low resistance portion and constitutes a main portion of the resistance element 3Q. Two diffusion regions PD3 (two epitaxial layers EP) sandwiching the impurity region LDD3 constitute both terminals Vin and Vout of the resistance element 3Q. Note that, although not illustrated here, a part of the well region NW3 constitutes a power supply region such as the power supply regions SR1 and SR2, and a back gate potential Vb3 can be supplied from this power supply region to the well region NW3.

However, if the back gate potential Vb3 is used when a current flows between the terminal Vin and the terminal Vout, a voltage applied to the insulating layer BOX of the resistance element 3Q increases, and the TDDB life of the insulating layer BOX of the resistance element 3Q may be degraded. Therefore, in the second embodiment, the back gate potential Vb3 is not supplied to the well region NW3 (Open). Namely, the well region NW3 is in an electrically floating state. As a result, the degradation of the TDDB life of the insulating layer BOX of the resistance element 3Q can be suppressed.

Furthermore, in the second embodiment, for the same reason as in the first embodiment, the energy of ion implantation of each of the impurity region LDD3 and the diffusion region PD3 is lower than that in the related art.

The ion implantation of the impurity region LDD3 is performed using boron difluoride ($BF_2$) under the conditions that an implantation energy is 5 keV or less and a dose amount is $4.0\times10^{14}/cm^2$. At this time, the ion implantation is set such that a position of the impurity concentration peak of the impurity region LDD3 is located in the semiconductor layer SL.

The ion implantation of the diffusion region PD3 is performed using boron (B) under the conditions that an implantation energy is 2 keV and a dose amount is $4.0\times10^{15}/cm^2$. At this time, the ion implantation is set such that a position of the impurity concentration peak of the diffusion region PD3 is located in the epitaxial layer EP.

The energy of the ion implantation of the impurity region LDD3 is lower than the energy of the ion implantation of the impurity region LDD2, similarly to the impurity region LDD1. Therefore, the degradation of the TDDB life of the insulating layer BOX of the resistance element 3Q can be further suppressed.

Figure 18:
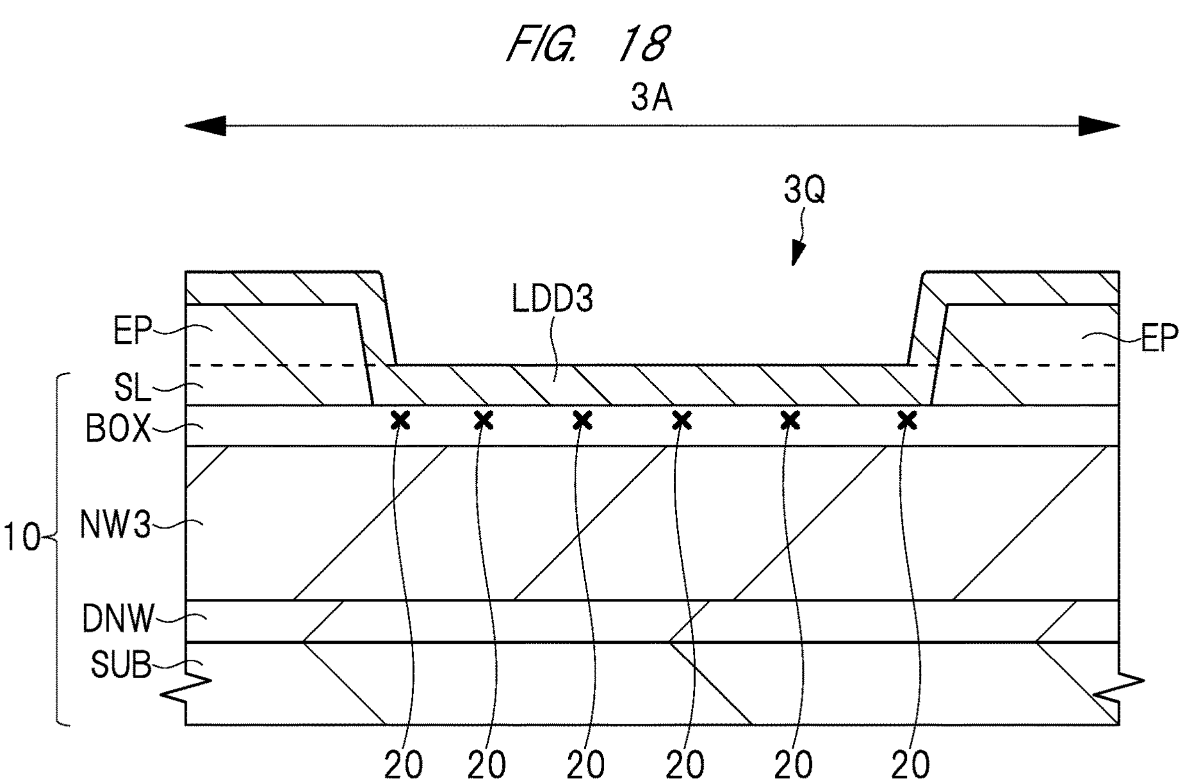
FIG. 18 is a cross-sectional view illustrating main features of the semiconductor device according to the second embodiment.

FIG. 18 is a cross-sectional view in which some configurations are omitted such that the formation position of the impurity region LDD3 can be easily understood for the same purpose as FIG. 4. The damaged layers 20 illustrated in FIG. 18 indicate damages in the insulating layer BOX caused by the ion implantation of the impurity region LDD3.

By lowering the energy of the ion implantation of the impurity region LDD3, the impurity concentration peak of the impurity region LDD3 is located farther from the insulating layer BOX than the impurity concentration peak of the impurity region LDD2 is. Therefore, the amount of the damaged layer 20 present in the insulating layer BOX located immediately below the impurity region LDD3 is smaller than the amount of the damaged layer 20 present in the insulating layer BOX located immediately below the impurity region LDD2.

As described above, in the semiconductor device according to the second embodiment, the degradation of the TDDB life of the insulating layer BOX of the resistance element 3Q can be suppressed, and the reliability of the semiconductor device can be improved.

Note that the step of performing the ion implantation of the impurity region LDD3 can be performed using a resist pattern having a pattern that selectively opens the region 3A after the step of FIG. 12 and before the step of FIG. 15. Furthermore, the step of performing the ion implantation of the diffusion region PD3 can be performed using a resist pattern having a pattern that selectively opens the region 3A after the step of FIG. 15 and before the step of forming the silicide film SI.

Third Embodiment

A semiconductor device according to a third embodiment will be described below with reference to FIG. 19 to FIG. 24. Note that, in the following description, differences from the first embodiment will be mainly described, and descriptions of the points overlapping with the first embodiment will be omitted.

In the first embodiment, the impurity regions LDD1 and LDD2 are formed after the epitaxial layer EP is formed. In the third embodiment, the epitaxial layer EP is formed after the impurity regions LDD1 and LDD2 are formed.

Figure 19:
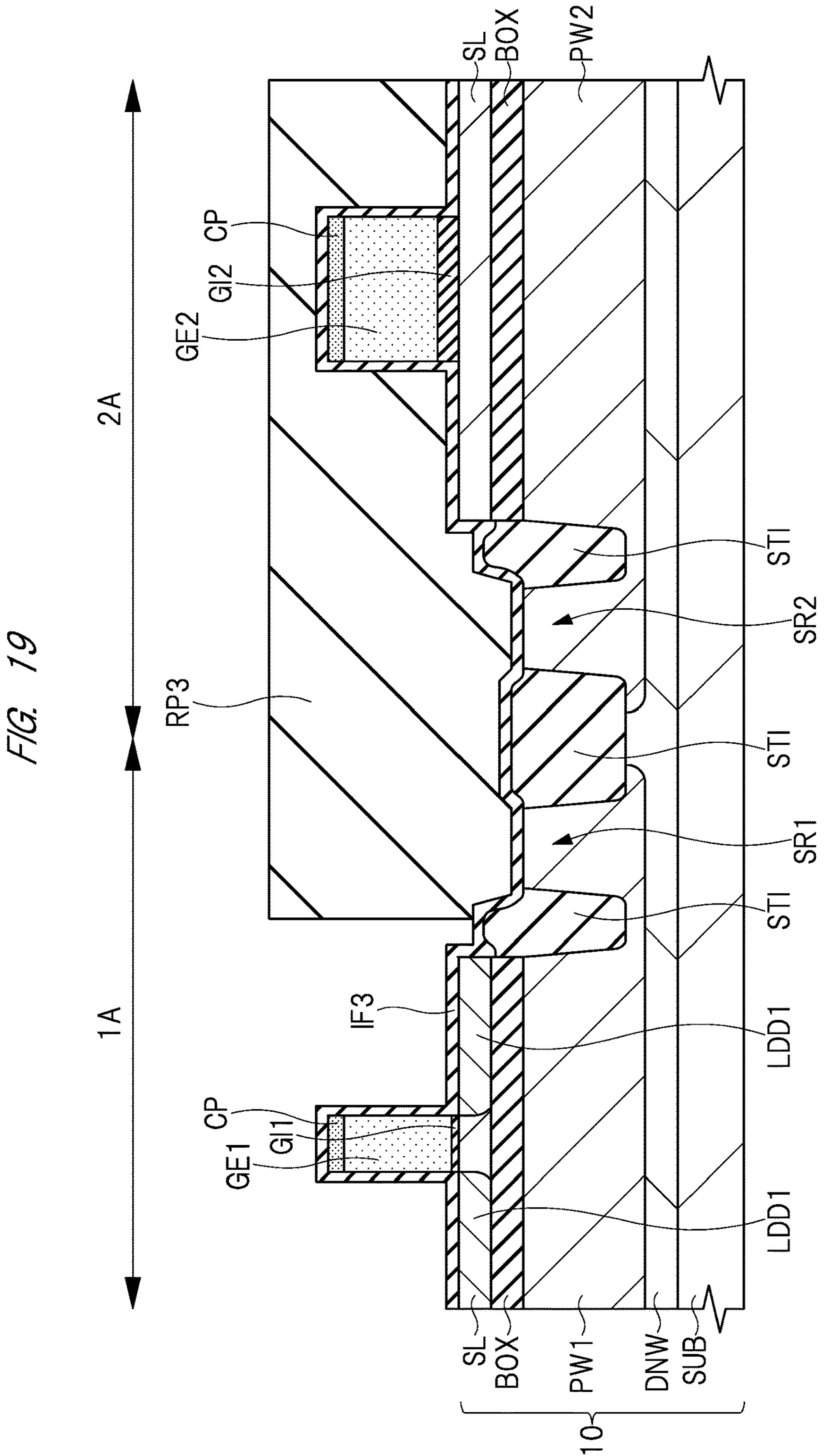
FIG. 19 is a cross-sectional view illustrating a manufacturing process of a semiconductor device according to a third embodiment.

The manufacturing process of the third embodiment is the same as that of the first embodiment until the structure in FIG. 10 is formed. FIG. 19 illustrates the manufacturing process subsequent to FIG. 10.

As illustrated in FIG. 19, first, the insulating film IF3 is formed on the semiconductor layer SL and the semiconductor substrate SUB by, for example, the CVD method so as to cover the gate electrodes GE1 and GE2 and the cap film CP. The insulating film IF3 is similar to that of the first embodiment.

Next, the resist pattern RP3 similar to that in FIG. 13 is formed. Next, the ion implantation using the resist pattern RP3 as a mask is performed to form the n-type impurity region LDD1 in the semiconductor layer SL in the region 1A. The ion implantation of the impurity region LDD1 is performed under the conditions similar to those of the first embodiment. Thereafter, the resist pattern RP3 is removed by the ashing process.

Note that, since the epitaxial layer EP is not formed at this stage, the impurity region LDD1 is formed in the entire semiconductor layer SL located beside the gate electrode GE1 in the ion implantation mentioned above.

Figure 20:
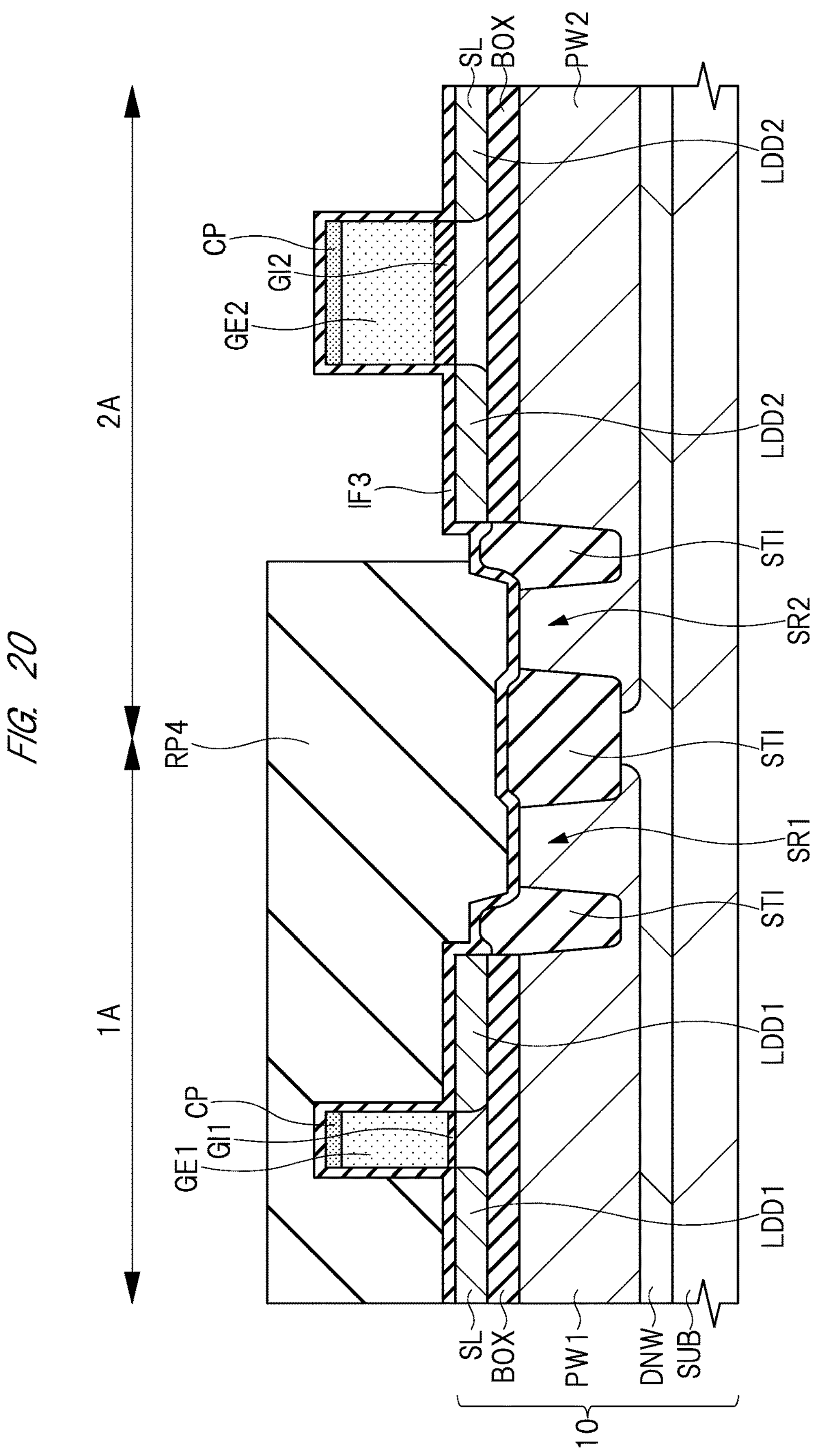
FIG. 20 is a cross-sectional view illustrating the manufacturing process of the semiconductor device subsequent to FIG. 19.

As illustrated in FIG. 20, first, the resist pattern RP4 similar to that in FIG. 14 is formed. Next, the ion implantation using the resist pattern RP4 as a mask is performed to form the n-type impurity region LDD2 in the semiconductor layer SL in the region 2A. The ion implantation of the impurity region LDD2 is performed under the conditions similar to those of the first embodiment. Thereafter, the resist pattern RP4 is removed by the ashing process.

Note that, since the epitaxial layer EP is not formed at this stage, the impurity region LDD2 is formed in the entire semiconductor layer SL located beside the gate electrode GE2 in the ion implantation mentioned above.

Furthermore, the order of the ion implantation of the impurity region LDD1 and the ion implantation of the impurity region LDD2 is not particularly limited.

Figure 21:
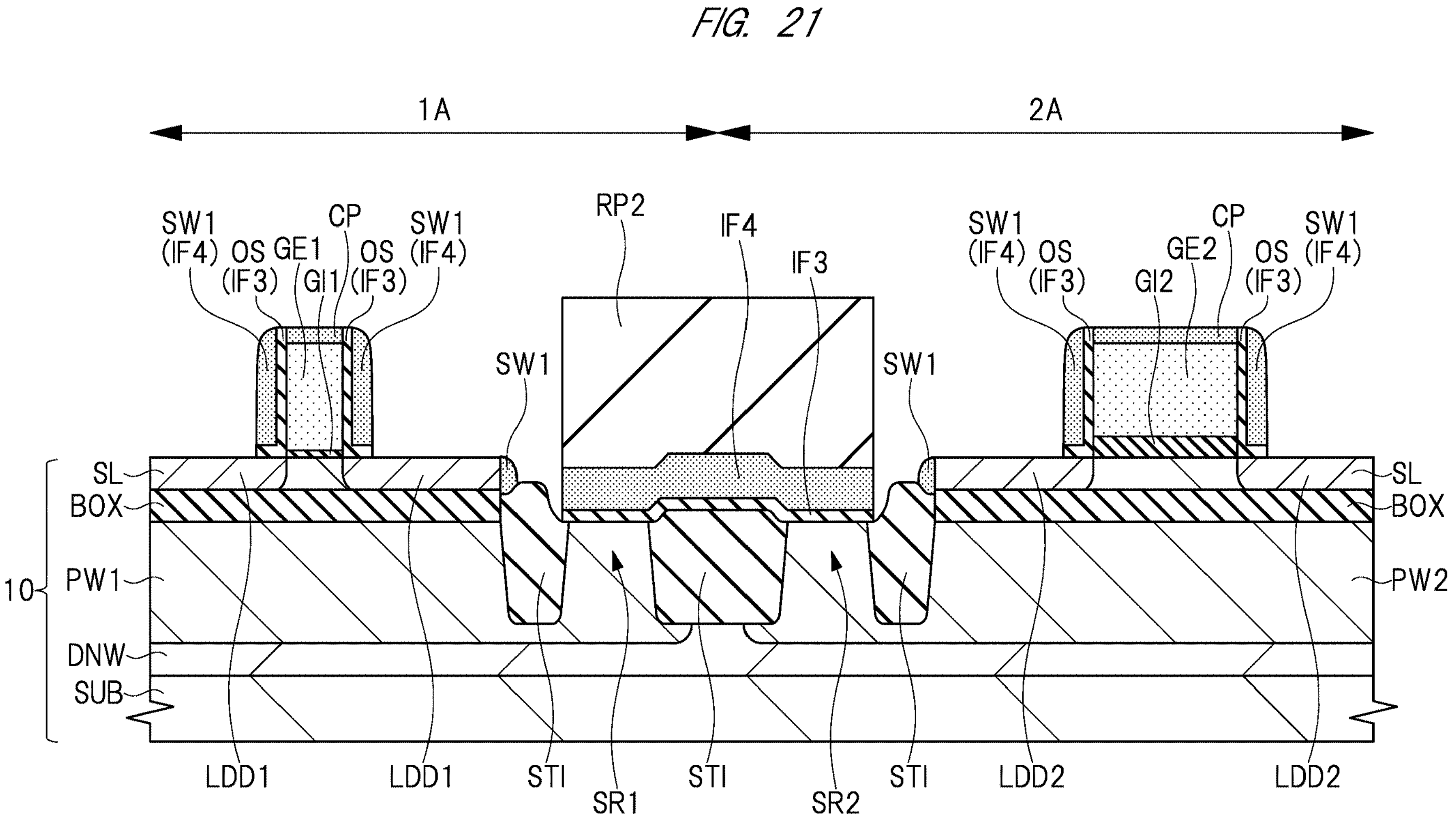
FIG. 21 is a cross-sectional view illustrating the manufacturing process of the semiconductor device subsequent to FIG. 20.

As illustrated in FIG. 21, first, the insulating film IF4 is formed on the insulating film IF3 by, for example, the CVD method. The insulating film IF4 is similar to that of the first embodiment.

Next, the resist pattern RP2 similar to that in FIG. 11 is formed. Next, the anisotropic etching process using the resist pattern RP2 as a mask is performed on the insulating film IF4 and the insulating film IF3 to form the sidewall spacer SW1 and the offset spacer OS on the side surfaces of the gate electrode GE1 and the gate electrode GE2, respectively. Note that the sidewall spacer SW1 is formed on the side surface of each of the gate electrodes GE1 and GE2 via the offset spacer OS. Furthermore, the power supply regions SR1 and SR2 are covered with the insulating films IF4 and IF3. Thereafter, the resist pattern RP2 is removed by the ashing process.

Figure 22:
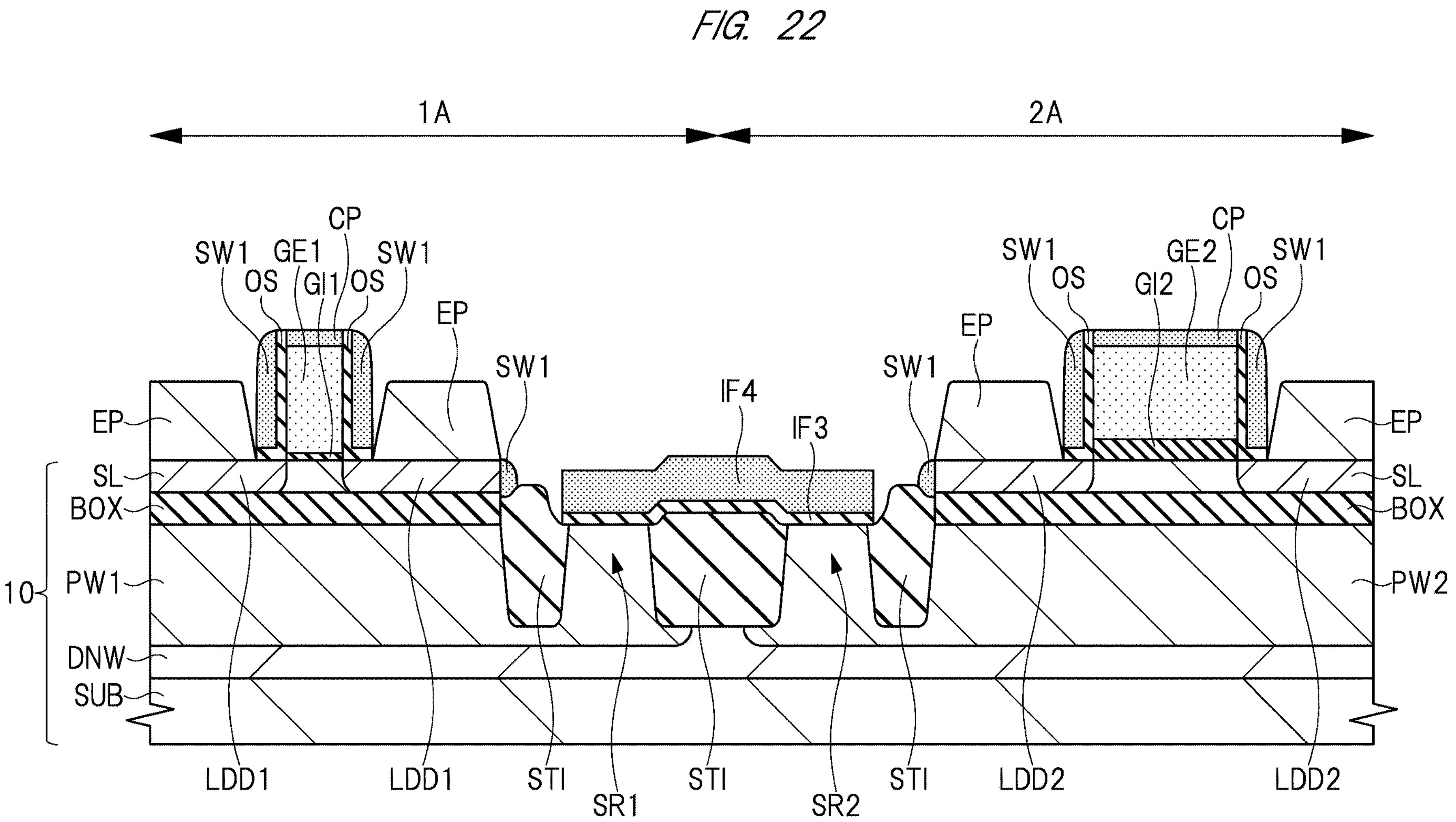
FIG. 22 is a cross-sectional view illustrating the manufacturing process of the semiconductor device subsequent to FIG. 21.

As illustrated in FIG. 22, the epitaxial layers EP are formed on the semiconductor layer SL in the region 1A and the region 2A by the epitaxial growth method. At this time, since an upper surface of each of the gate electrodes GE1 and GE2 is covered with the cap film CP, the epitaxial layer EP is not formed on the upper surface of each of the gate electrodes GE1 and GE2. Furthermore, since the power supply regions SR1 and SR2 are covered with the insulating film IF4, the epitaxial layer EP is not formed on the semiconductor substrate SUB of each of the power supply regions SR1 and SR2.

Figure 23:
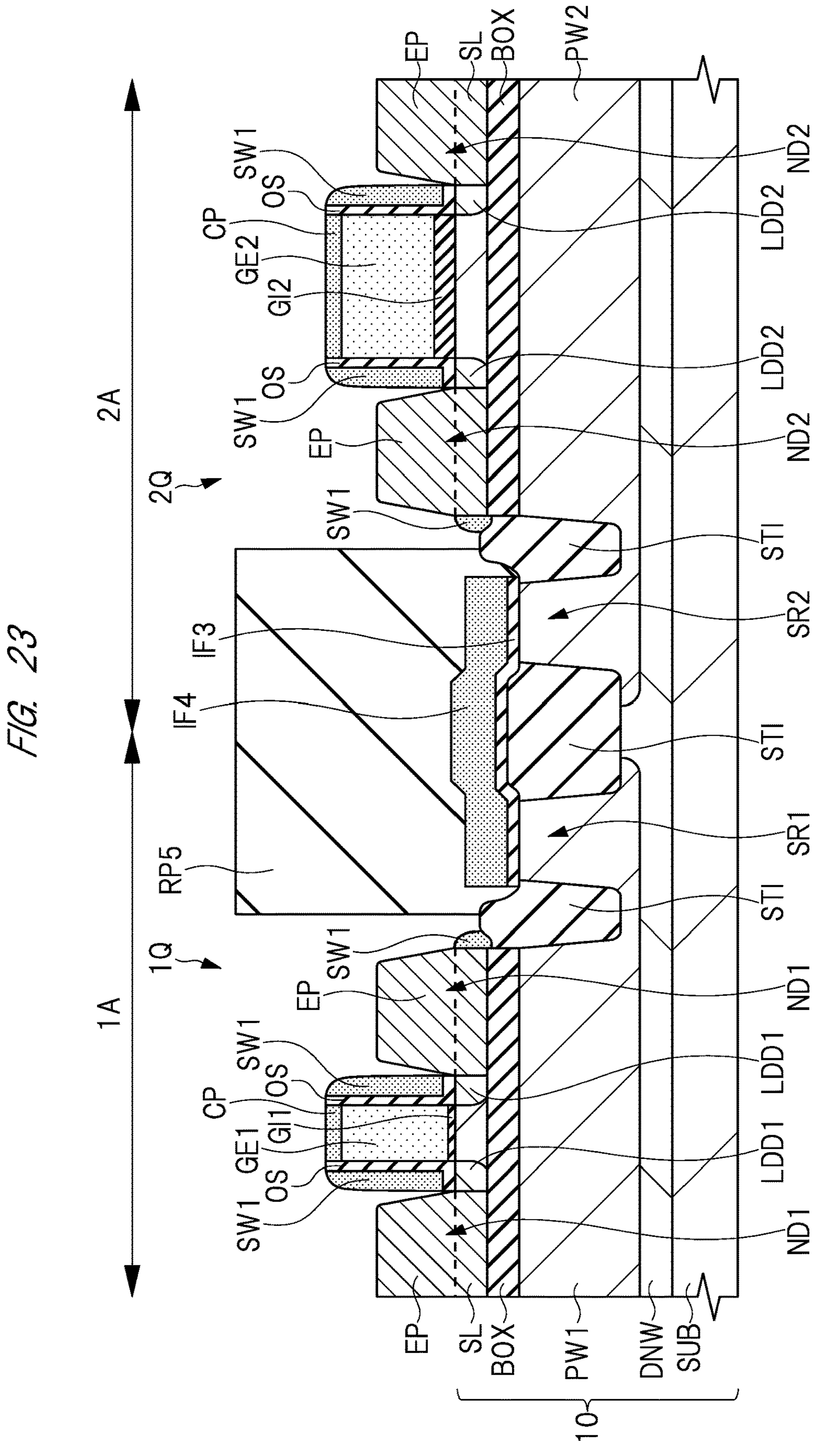
FIG. 23 is a cross-sectional view illustrating the manufacturing process of the semiconductor device subsequent to FIG. 22.

As illustrated in FIG. 23, first, the resist pattern RP5 similar to that in FIG. 16 is formed. Next, the ion implantation using the resist pattern RP5 as a mask is performed to form the n-type diffusion regions ND1 and ND2 in the semiconductor layer SL and the epitaxial layer EP exposed from the sidewall spacer SW1 in the region 1A and the region 2A. The ion implantation of the diffusion regions ND1 and ND2 is performed under the conditions similar to those of the first embodiment. Thereafter, the resist pattern RP5 is removed by the ashing process.

As described above, the low withstand voltage MISFET 1Q is formed in the region 1A, and the high withstand voltage MISFET 2Q is formed in the region 2A.

Thereafter, the insulating films IF4 and IF3 formed in the power supply regions SR1 and SR2 are selectively removed, and then the silicide film SI similar to that of the first embodiment is formed.

Figure 24:
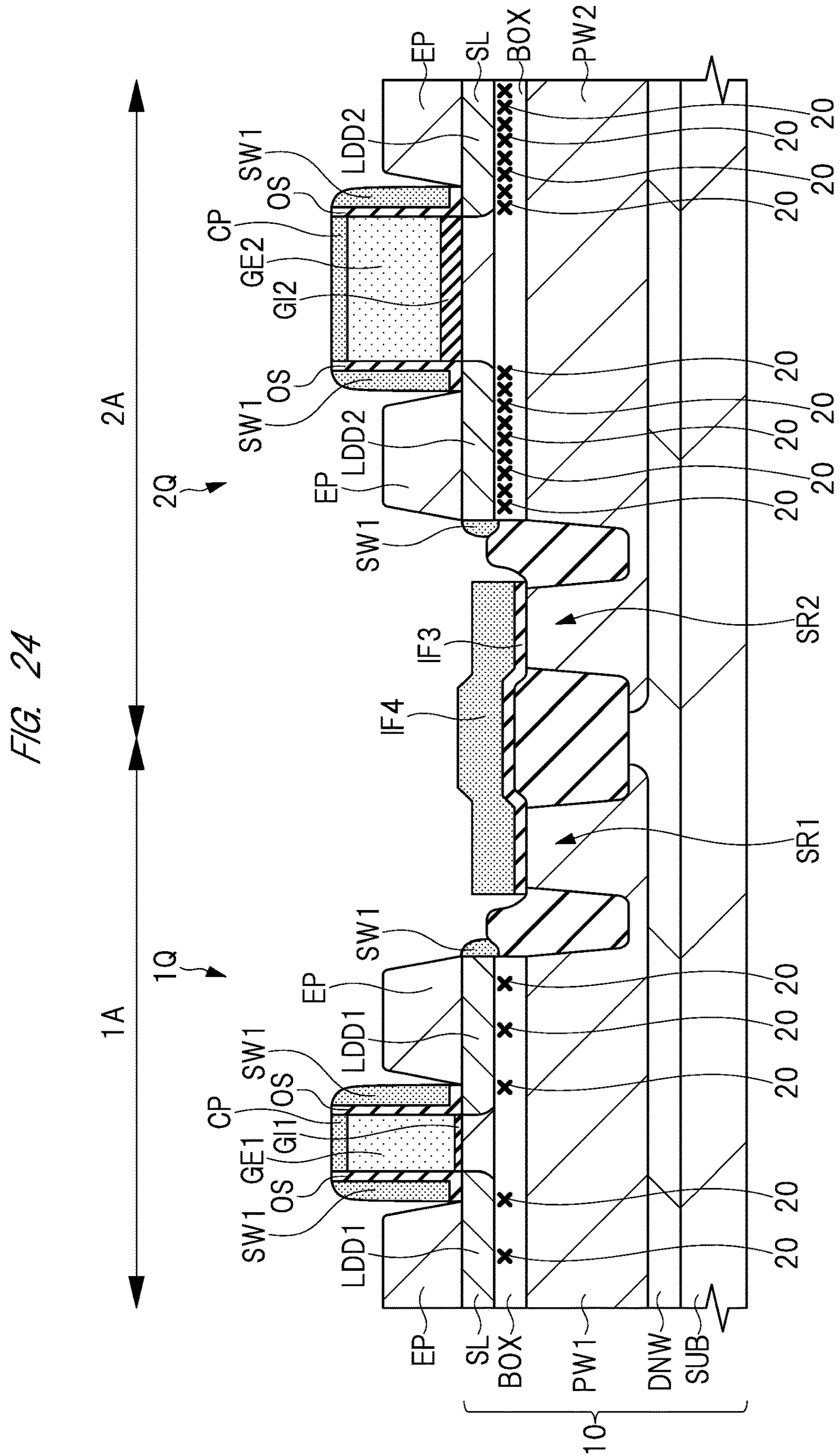
FIG. 24 is a cross-sectional view illustrating main features of the semiconductor device according to the third embodiment.

FIG. 24 is a cross-sectional view in which some configurations are omitted such that the formation positions of the impurity regions LDD1 and LDD2 can be easily understood for the same purpose as FIG. 4.

In the third embodiment, similarly to the first embodiment, the energy of the ion implantation of the impurity region LDD2 is higher than the energy of the ion implantation of the impurity region LDD1, and the impurity concentration peak of the impurity region LDD2 is located closer to the insulating layer BOX than the impurity concentration peak of the impurity region LDD1 is, and is preferably located in the insulating layer BOX.

Therefore, as illustrated in FIG. 24, the amount of the damaged layer 20 present in the insulating layer BOX located immediately below the impurity region LDD2 is larger than the amount of the damaged layer 20 present in the insulating layer BOX located immediately below the impurity region LDD1.

Also in the third embodiment, the degradation of the TDDB life of the insulating layer BOX can be suppressed in the low withstand voltage MISFET 1Q and the high withstand voltage MISFET 2Q, and the deterioration of the gate insulating film GI2 over time due to hot carrier injection can be suppressed in the high withstand voltage MISFET 2Q. Therefore, the reliability of the semiconductor device can be improved.

Note that, in the first embodiment, the impurity regions LDD1 and LDD2 are formed in a part of the semiconductor layer SL located beside the gate electrodes GE1 and GE2. On the other hand, in the third embodiment, the impurity regions LDD1 and LDD2 are formed in the entire semiconductor layer SL located beside the gate electrodes GE1 and GE2. Namely, since the impurity regions LDD1 and LDD2 are also formed in the semiconductor layer SL below the epitaxial layer EP, resistance can be reduced in the semiconductor layer SL below the epitaxial layer EP. Therefore, in the third embodiment, the resistance of the source region and the drain region of each of the low withstand voltage MISFET 1Q and the high withstand voltage MISFET 2Q can be reduced as compared with the first embodiment.

Furthermore, the resistance values of the entire source and drain regions can be adjusted to the same level as in the first embodiment. For example, the impurity concentration of each of the impurity regions LDD1 and LDD2 may be made lower than that of the first embodiment. Namely, the dose amount of the ion implantation of each of the impurity regions LDD1 and LDD2 may be made smaller than the condition of FIG. 3. In this way, the probability that ions are implanted into the insulating layer BOX decreases, so that the degradation of the TDDB life of the insulating layer BOX of each of the low withstand voltage MISFET 1Q and the high withstand voltage MISFET 2Q can be further suppressed.

Furthermore, in the high withstand voltage MISFET 2Q, the impurity concentration of the impurity region LDD2 decreases, so that the electric field in the vicinity of the drain region can be relaxed. Therefore, hot carriers are less likely to be injected into the gate insulating film GI2, and the deterioration of the gate insulating film GI2 over time can be further suppressed.

Note that the impurity concentration of the impurity region LDD2 may be lowered only in the high withstand voltage MISFET 2Q. Namely, the impurity concentration of the impurity region LDD2 may be lower than the impurity concentration of the impurity region LDD1.

In the foregoing, the present invention has been specifically described based on the embodiments, but the present invention is not limited to the embodiments described above and various modifications can be made within the range not departing from the gist thereof.

What is claimed is:

1. A semiconductor device including a first region in which a first MISFET of a first conductivity type is formed and a second region in which a second MISFET of the first conductivity type is formed, the semiconductor device comprising:

an SOI substrate including a semiconductor substrate, an insulating layer formed on the semiconductor substrate, and a semiconductor layer formed on the insulating layer;

a first well region formed in the semiconductor substrate in the first region, a conductivity type of the first well region being a second conductivity type opposite the first conductivity type;

a first gate insulating film formed on the semiconductor layer in the first region;

a first gate electrode formed on the first gate insulating film;

a first impurity region formed in the semiconductor layer located beside the first gate electrode, a conductivity type of the first impurity region being the first conductivity type;

a second well region formed in the semiconductor substrate in the second region, a conductivity type of the second well region being the second conductivity type;

a second gate insulating film formed on the semiconductor layer in the second region;

a second gate electrode formed on the second gate insulating film; and a second impurity region formed in the semiconductor layer located beside the second gate electrode, a conductivity type of the second impurity region being the first conductivity type, wherein a thickness of the second gate insulating film is larger than a thickness of the first gate insulating film, wherein a gate length of the second gate electrode is longer than a gate length of the first gate electrode, wherein an ON operation and an OFF operation of the first MISFET are controlled by a first gate potential to be supplied to the first gate electrode and a first back gate potential to be supplied to the first well region, wherein an ON operation and an OFF operation of the second MISFET are controlled by a second gate potential to be supplied to the second gate electrode in a state where the second well region is electrically floating, and wherein an absolute value of a second power supply potential to be supplied to the second impurity region is larger than an absolute value of a first power supply potential to be supplied to the first impurity region.

2. The semiconductor device according to claim 1, further comprising:

a first epitaxial layer formed on the semiconductor layer in the first region;

a first diffusion region formed in the first epitaxial layer and the semiconductor layer in the first region;

a second epitaxial layer formed on the semiconductor layer in the second region; and a second diffusion region formed in the second epitaxial layer and the semiconductor layer in the second region, wherein an impurity concentration of the first diffusion region is higher than an impurity concentration of the first impurity region, wherein an impurity concentration of the second diffusion region is higher than an impurity concentration of the second impurity region, wherein the first epitaxial layer and the first diffusion region are formed at positions farther from the first gate electrode than the first impurity region is, and wherein the second epitaxial layer and the second diffusion region are formed at positions farther from the second gate electrode than the second impurity region is.

3. The semiconductor device according to claim 2, wherein the impurity concentration of the second impurity region is lower than the impurity concentration of the first impurity region.

4. The semiconductor device according to claim 1, wherein an amount of a damaged layer which is present in the insulating layer located immediately below the second impurity region and in which atoms constituting the insulating layer are partially lost is larger than an amount of a damaged layer which is present in the insulating layer located immediately below the first impurity region and in which atoms constituting the insulating layer are partially lost.

5. The semiconductor device according to claim 1, further comprising a third region in which a resistance element is formed, wherein the resistance element includes a third impurity region of the second conductivity type formed in the semiconductor layer in the third region, and wherein an amount of a damaged layer which is present in the insulating layer located immediately below the second impurity region and in which atoms constituting the insulating layer are partially lost is larger than an amount of a damaged layer which is present in the insulating layer located immediately below the third impurity region and in which atoms constituting the insulating layer are partially lost.

6. The semiconductor device according to claim 1, wherein the first region is provided with a power supply region from which the semiconductor layer and the insulating layer have been removed, but the second region is not provided with a power supply region from which the semiconductor layer and the insulating layer have been removed, and wherein the ON operation and the OFF operation of the first MISFET are controlled by the first gate potential to be supplied to the first gate electrode and the first back gate potential to be supplied to the first well region via the power supply region provided in the first region.

7. The semiconductor device according to claim 1, further comprising a fourth region in which a third MISFET of the first conductivity type is formed and from which the semiconductor layer and the insulating layer have been removed, wherein the third MISFET includes:

a third well region formed in the semiconductor substrate in the fourth region, a conductivity type of the third well region being the second conductivity type;

a third gate insulating film formed on the semiconductor substrate in the fourth region;

a third gate electrode formed on the third gate insulating film; and a third impurity region formed in the semiconductor substrate located beside the third gate electrode, a conductivity type of the third impurity region being the first conductivity type, wherein a thickness of the third gate insulating film is larger than the thickness of the second gate insulating film, wherein a gate length of the third gate electrode is longer than the gate length of the second gate electrode, wherein an ON operation and an OFF operation of the third MISFET are controlled by a third gate potential to be supplied to the third gate electrode, and wherein an absolute value of a third power supply potential to be supplied to the third impurity region is larger than the absolute value of the second power supply potential to be supplied to the second impurity region.

8. A method of manufacturing a semiconductor device including a first region in which a first MISFET of a first conductivity type is formed and a second region in which a second MISFET of the first conductivity type is formed, the method comprising steps of:

(a) preparing an SOI substrate including a semiconductor substrate, an insulating layer formed on the semiconductor substrate, and a semiconductor layer formed on the insulating layer;

(b) forming a first well region in the semiconductor substrate in the first region, a conductivity type of the first well region being a second conductivity type opposite the first conductivity type;

(c) forming a second well region in the semiconductor substrate in the second region, a conductivity type of the second well region being the second conductivity type;

(d) forming a second gate insulating film on the semiconductor layer in the second region;

(e) forming a first gate insulating film on the semiconductor layer in the first region;

(f) forming a first gate electrode on the first gate insulating film;

(g) forming a second gate electrode on the second gate insulating film;

(h) forming a first impurity region in the semiconductor layer located beside the first gate electrode by ion implantation, a conductivity type of the first impurity region being the first conductivity type; and (i) forming a second impurity region in the semiconductor layer located beside the second gate electrode by ion implantation, a conductivity type of the second impurity region being the first conductivity type, wherein a thickness of the second gate insulating film is larger than a thickness of the first gate insulating film, wherein a gate length of the second gate electrode is longer than a gate length of the first gate electrode, and wherein an energy of the ion implantation in the step (i) is higher than an energy of the ion implantation in the step (h).

9. The method of manufacturing the semiconductor device according to claim 8, wherein an amount of a damaged layer which is formed in the insulating layer located immediately below the second impurity region by the ion implantation in the step (i) and in which atoms constituting the insulating layer are partially lost is larger than an amount of a damaged layer which is formed in the insulating layer located immediately below the first impurity region by the ion implantation in the step (h) and in which atoms constituting the insulating layer are partially lost.

10. The method of manufacturing the semiconductor device according to claim 8, wherein an ON operation and an OFF operation of the first MISFET are controlled by a first gate potential to be supplied to the first gate electrode and a first back gate to be potential supplied to the first well region, wherein an ON operation and an OFF operation of the second MISFET are controlled by a second gate potential to be supplied to the second gate electrode in a state where the second well region is electrically floating, and wherein an absolute value of a second power supply potential to be supplied to the second impurity region is larger than an absolute value of a first power supply potential to be supplied to the first impurity region.

11. The method of manufacturing the semiconductor device according to claim 8, further comprising steps of:

(j) forming a first epitaxial layer on the semiconductor layer in the first region and forming a second epitaxial layer on the semiconductor layer in the second region; and (k) forming a first diffusion region in the first epitaxial layer and the semiconductor layer in the first region, a conductivity type of the first diffusion region being the first conductivity type, and forming a second diffusion region in the second epitaxial layer and the semiconductor layer in the second region, a conductivity type of the second diffusion region being the first conductivity type, wherein an impurity concentration of the first diffusion region is higher than an impurity concentration of the first impurity region, wherein an impurity concentration of the second diffusion region is higher than an impurity concentration of the second impurity region, wherein, after the step (k), the first epitaxial layer and the first diffusion region are formed at positions farther from the first gate electrode than the first impurity region is, and wherein, after the step (k), the second epitaxial layer and the second diffusion region are formed at positions farther from the second gate electrode than the second impurity region is.

12. The method of manufacturing the semiconductor device according to claim 11, wherein the step (h) and the step (i) are performed between the step (j) and the step (k).

13. The method of manufacturing the semiconductor device according to claim 12, wherein, in the step (h), the first impurity region is formed in a part of the semiconductor layer in the first region located beside the first gate electrode, and wherein, in the step (i), the second impurity region is formed in a part of the semiconductor layer in the second region located beside the second gate electrode.

14. The method of manufacturing the semiconductor device according to claim 11, wherein the step (h) and the step (i) are performed before the step (j), and wherein the step (k) is performed after the step (j).

15. The method of manufacturing the semiconductor device according to claim 14, wherein, in the step (h), the first impurity region is formed in the entire semiconductor layer in the first region located beside the first gate electrode, and wherein, in the step (i), the second impurity region is formed in the entire semiconductor layer in the second region located beside the second gate electrode.

16. The method of manufacturing the semiconductor device according to claim 15, wherein the impurity concentration of the second impurity region is lower than the impurity concentration of the first impurity region.

17. The method of manufacturing the semiconductor device according to claim 8, the semiconductor device further including a third region in which a resistance element is formed, the method further comprising a step of (l) forming a third impurity region in the semiconductor layer in the third region by ion implantation, a conductivity type of the third impurity region being the second conductivity type, wherein an energy of the ion implantation in the step (i) is higher than an energy of the ion implantation in the step (l).

18. The method of manufacturing the semiconductor device according to claim 17, wherein an amount of a damaged layer which is formed in the insulating layer located immediately below the second impurity region by the ion implantation in the step (i) and in which atoms constituting the insulating layer are partially lost is larger than an amount of a damaged layer which is formed in the insulating layer located immediately below the third impurity region by the ion implantation in the step (l) and in which atoms constituting the insulating layer are partially lost.

* * * * *